(12) United States Patent
Tsukamoto et al.

(10) Patent No.: US 10,958,242 B2
(45) Date of Patent: Mar. 23, 2021

(54) ACOUSTIC WAVE FILTER DEVICE, MULTIPLEXER, RADIO-FREQUENCY FRONT END CIRCUIT, AND COMMUNICATION DEVICE

(71) Applicant: Murata Manufacturing Co., Ltd., Kyoto (JP)

(72) Inventors: Hideki Tsukamoto, Kyoto (JP); Koji Nosaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 132 days.

(21) Appl. No.: 16/365,839

(22) Filed: Mar. 27, 2019

(65) Prior Publication Data

US 2019/0222198 A1 Jul. 18, 2019

Related U.S. Application Data

(63) Continuation of application No. PCT/JP2017/033977, filed on Sep. 20, 2017.

(30) Foreign Application Priority Data

Sep. 29, 2016 (JP) .............................. JP2016-192348

(51) Int. Cl.
| | | |
|---|---|---|
| *H03H 9/54* | (2006.01) | |
| *H03H 9/64* | (2006.01) | |
| *H03H 9/72* | (2006.01) | |
| *H04B 1/525* | (2015.01) | |
| *H03H 9/205* | (2006.01) | |

(Continued)

(52) U.S. Cl.
CPC ........ *H03H 9/542* (2013.01); *H03H 9/02007* (2013.01); *H03H 9/171* (2013.01);
(Continued)

(58) Field of Classification Search
CPC ........... H03H 9/02007; H03H 9/02102; H03H 9/171; H03H 9/205; H03H 9/542;
(Continued)

(56) References Cited

U.S. PATENT DOCUMENTS 5,999,069 A * 12/1999 Ushiroku ............. H03H 9/6483
333/193
6,023,611 A 2/2000 Bolin et al.
(Continued)

FOREIGN PATENT DOCUMENTS

JP          11-312951 A   * 11/1999
JP         2001-512642 A    8/2001
(Continued)

OTHER PUBLICATIONS

K. Baraka et al.; "Reconfiguration of Bulk Acoustic Wave Filters Using RF-MEMS Switches and CMOS Transistors"; Proceedings of the 8th IEEE International NEWCAS Conference 2010, Conference date Jun. 20-23, 2010, pp. 169-172 and 1 page IEEE Xplore abstract. (Year: 2010).*

(Continued)

*Primary Examiner* — Barbara Summons
(74) *Attorney, Agent, or Firm* — Pearne & Gordon LLP

(57) ABSTRACT

A filter includes a series arm resonator, a first parallel arm resonance circuit, and a second parallel arm resonance circuit. The first parallel arm resonance circuit includes: a first parallel arm resonator connected to a first node; a first capacitor and a first switch connected together in parallel and connected in series with the first parallel arm resonator; and a first inductor provided on a path connecting the node and ground to each other via the first switch. The second parallel arm resonance circuit includes: a second parallel arm resonator connected to a second node; a second capacitor and a second switch connected together in parallel and connected in series with the second parallel arm resonator; and a second inductor provided on a path connecting the second node and ground to each other via the second switch. The first and second inductor have different inductance values.

20 Claims, 16 Drawing Sheets

(51) Int. Cl.
  *H03H 9/17*    (2006.01)
  *H03H 9/60*    (2006.01)
  *H04B 1/403*   (2015.01)
  *H03H 9/70*    (2006.01)
  *H03H 9/56*    (2006.01)
  *H04B 1/00*    (2006.01)
  *H03H 9/02*    (2006.01)

(52) U.S. Cl.
  CPC ............ *H03H 9/205* (2013.01); *H03H 9/568* (2013.01); *H03H 9/605* (2013.01); *H03H 9/64* (2013.01); *H03H 9/6403* (2013.01); *H03H 9/6483* (2013.01); *H03H 9/706* (2013.01); *H03H 9/72* (2013.01); *H03H 9/725* (2013.01); *H04B 1/006* (2013.01); *H04B 1/403* (2013.01); *H04B 1/525* (2013.01); *H03H 9/02102* (2013.01)

(58) Field of Classification Search
  CPC .......... H03H 9/568; H03H 9/605; H03H 9/64; H03H 9/6403; H03H 9/6483; H03H 9/706; H03H 9/72; H03H 9/725; H04B 1/00; H04B 1/006; H04B 1/0475; H04B 1/403; H04B 1/525
  USPC ..................... 333/133, 193, 195, 189, 186
  See application file for complete search history.

(56) References Cited

U.S. PATENT DOCUMENTS

| | | | | |
|---|---|---|---|---|
| 6,472,953 | B1 * | 10/2002 | Sakuragawa | H03H 9/6483 333/133 |
| 6,919,777 | B2 * | 7/2005 | Taniguchi | H03H 9/0557 333/133 |
| RE40,036 | E * | 1/2008 | Satoh | H03H 9/6483 310/313 R |
| 9,246,536 | B2 * | 1/2016 | Caron | H04B 1/52 |
| 9,866,366 | B2 * | 1/2018 | Pehlke | H04L 5/14 |
| 10,715,110 | B2 * | 7/2020 | Horita | H04B 1/0458 |
| 2002/0180562 | A1 | 12/2002 | Taniguchi | |
| 2003/0227358 | A1 * | 12/2003 | Inose | H03H 9/6423 333/193 |
| 2007/0210876 | A1 | 9/2007 | Yahata et al. | |
| 2009/0251235 | A1 | 10/2009 | Belot et al. | |
| 2019/0214969 | A1 * | 7/2019 | Wada | H03H 9/542 |
| 2019/0267969 | A1 * | 8/2019 | Tsukamoto | H03H 9/725 |

FOREIGN PATENT DOCUMENTS

| | | |
|---|---|---|
| JP | 2002-314372 A | 10/2002 |
| JP | 2004-072549 A | 3/2004 |
| JP | 2010-062816 A | 3/2010 |
| JP | 2013-239839 A | 11/2013 |
| WO | 2005/125008 A1 | 12/2005 |

OTHER PUBLICATIONS

English language machine translation of JP 2010-062816 A, published on Mar. 18, 2010, 13 pages. (Year: 2010).*
International Search Report for International Application No. PCT/JP2017/033977, dated Dec. 12, 2017.
Written Opinion for International Application No. PCT/JP2017/033977, dated Dec. 12, 2017.

* cited by examiner

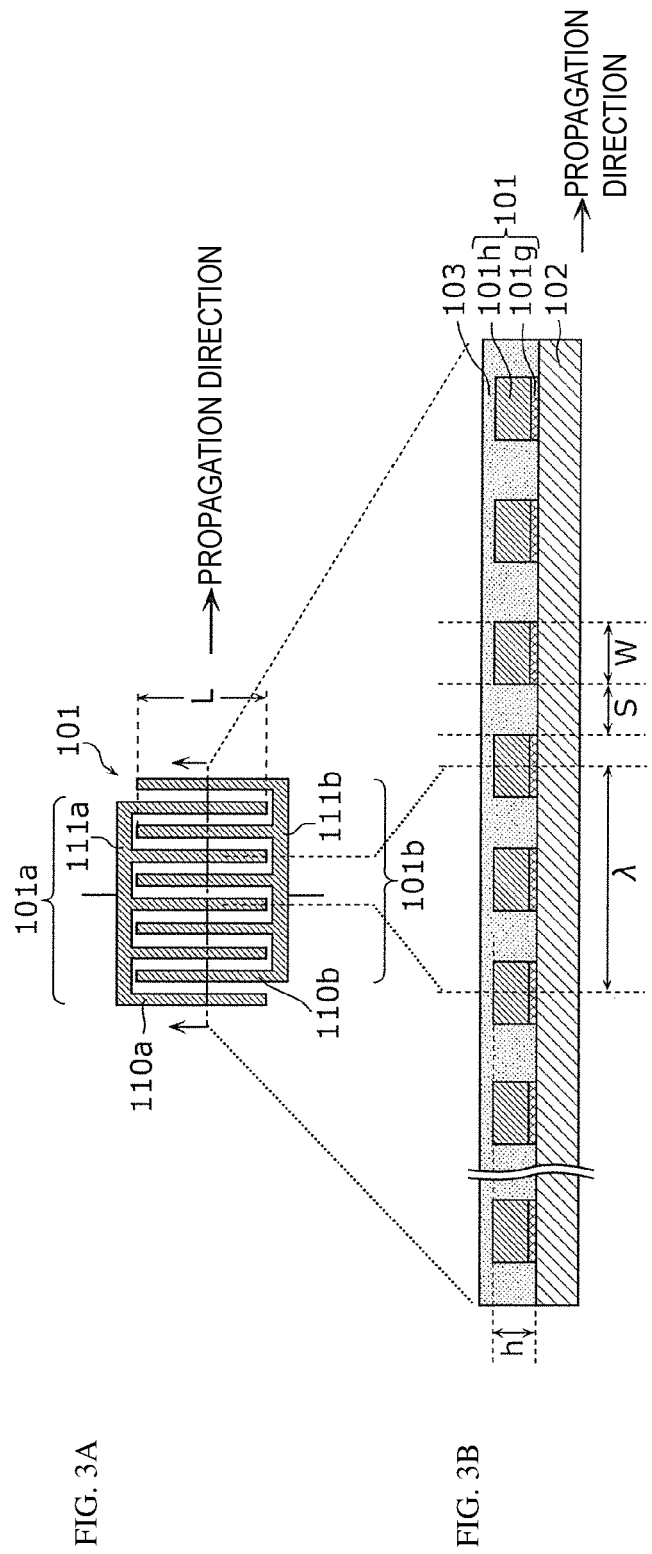

FIG. 9A

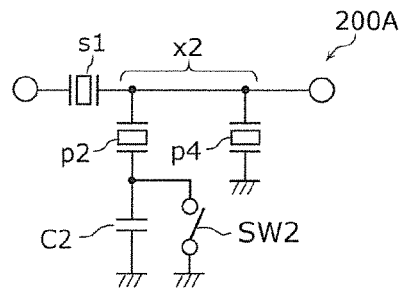

FIG. 9B

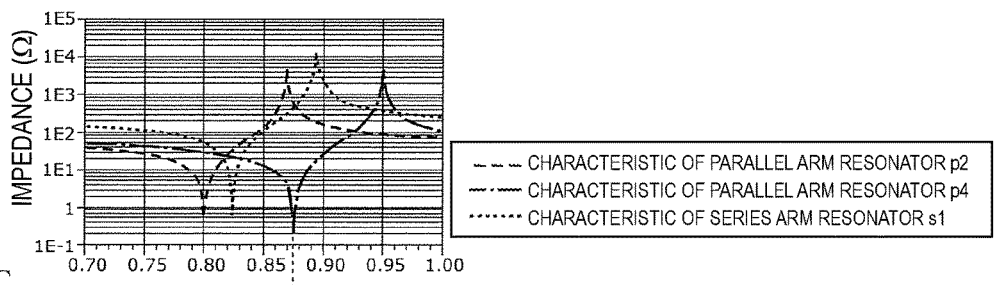

- - - CHARACTERISTIC OF PARALLEL ARM RESONATOR p2
-·- CHARACTERISTIC OF PARALLEL ARM RESONATOR p4
······ CHARACTERISTIC OF SERIES ARM RESONATOR s1

FIG. 9C

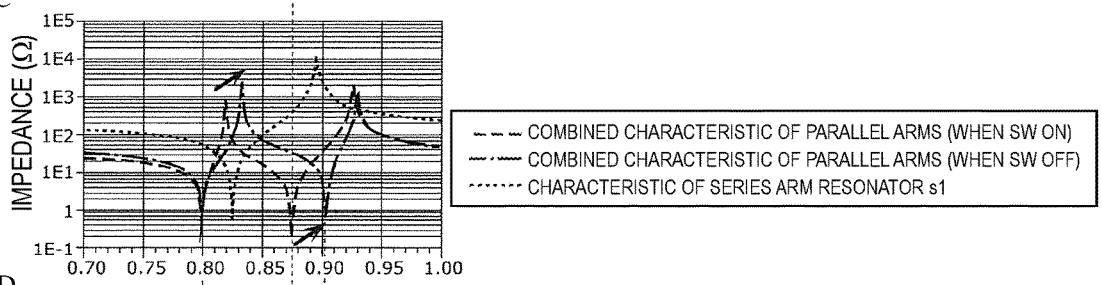

- - - COMBINED CHARACTERISTIC OF PARALLEL ARMS (WHEN SW ON)
-·- COMBINED CHARACTERISTIC OF PARALLEL ARMS (WHEN SW OFF)
······ CHARACTERISTIC OF SERIES ARM RESONATOR s1

FIG. 9D

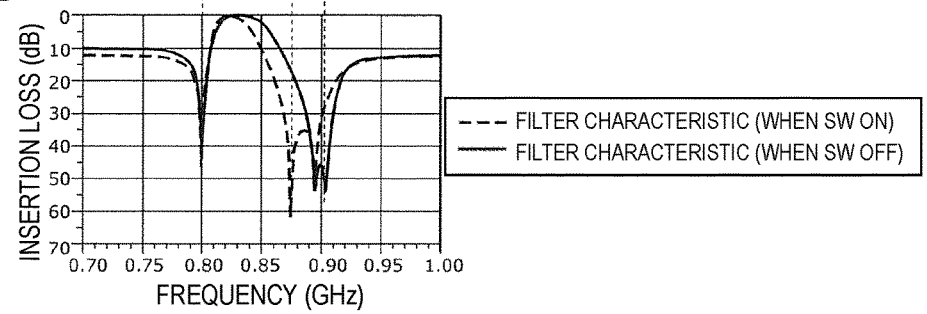

- - - FILTER CHARACTERISTIC (WHEN SW ON)
——— FILTER CHARACTERISTIC (WHEN SW OFF)

FREQUENCY (GHz)

ACOUSTIC WAVE FILTER DEVICE, MULTIPLEXER, RADIO-FREQUENCY FRONT END CIRCUIT, AND COMMUNICATION DEVICE

This is a continuation of International Application No. PCT/JP2017/033977 filed on Sep. 20, 2017 which claims priority from Japanese Patent Application No. 2016-192348 filed on Sep. 29, 2016. The contents of these applications are incorporated herein by reference in their entireties.

BACKGROUND OF THE DISCLOSURE

Field of the Disclosure

The present disclosure relates to an acoustic wave filter device including a resonator, and to a multiplexer, a radio-frequency front end circuit, and a communication device.

Description of the Related Art

In the related art, acoustic wave filter devices that employ acoustic waves are widely used in band pass filters and the like that are arranged in the front end units of mobile communication devices. In addition, radio-frequency front end circuits and communication devices have been implemented that include a plurality of acoustic wave filter devices in order to support combinations such as multiple modes, multiple bands, and so on.

For example, as an acoustic wave filter device that supports multiple bands, such a configuration that a pair of elements consisting of a capacitor and a switch, which are connected in parallel with each other, is serially connected to a parallel arm resonance circuit (parallel arm resonator) of a ladder filter formed of bulk acoustic wave (BAW) resonators is known (for example, refer to Patent Document 1). The thus-configured acoustic wave filter device forms a variable-frequency acoustic wave filter device that enables the frequency of a pass band and the frequency of an attenuation band on the low-frequency-side of the pass band to be changed in accordance with whether a switch is in a conductive state or a non-conductive state.

Patent Document 1: US Patent Application Publication No. 2009/0251235

BRIEF SUMMARY OF THE DISCLOSURE

Together with support for multiple bands and so forth in recent years, there is a demand that the band width of an attenuation band also be variable when making the frequency of the pass band variable in accordance with whether a switch is in a conductive state or a non-conductive state.

However, in the above-described configuration of the related art, in the case where the inductance values of paths that connect parallel arm resonators and switches in the parallel arms of the acoustic wave filter device are identical, there is a problem in that the band width of an attenuation band is decreased when the frequency of the pass band and the frequency of the attenuation band are shifted toward the low-frequency side by switching a switch.

Accordingly, the present disclosure was made in order to solve this problem and it is an object thereof to provide an acoustic wave filter device and so forth that can increase the attenuation band width when switching the frequency of a pass band and the frequency of an attenuation band to lower frequencies.

In order to achieve this object, an acoustic wave filter device according to an embodiment of the present disclosure includes: a first series arm resonance circuit provided on a path that connects a first input/output terminal and a second input/output terminal to each other; a first parallel arm resonance circuit that is connected between a first node, which is closer to the first input/output terminal than the first series arm resonance circuit, and ground among nodes on the path that connects the first input/output terminal and the second input/output terminal to each other; and a second parallel arm resonance circuit that is connected between a second node, which is closer to the second input/output terminal than the first series arm resonance circuit, and ground among the nodes on the path that connects the first input/output terminal and the second input/output terminal to each other. The first parallel arm resonance circuit includes a first parallel arm resonator that is connected to the first node, a pair of elements consisting of a first impedance element and a first switch, which are connected in parallel with each other, that is connected in series with the first parallel arm resonator between the first node and ground, and a first inductor that is provided on a path that connects the first node and ground to each other via the first switch. The second parallel arm resonance circuit includes a second parallel arm resonator that is connected to the second node, a pair of elements consisting of a second impedance element and a second switch, which are connected in parallel with each other, that is connected in series with the second parallel arm resonator between the second node and ground, and a second inductor that is provided on a path that connects the second node and ground to each other via the second switch. An inductance value of the first inductor and an inductance value of the second inductor are different from each other.

According to this configuration, the acoustic wave filter device is formed of the first series arm resonance circuit, the first parallel arm resonance circuit, and the second parallel arm resonance circuit, and has a plurality of bandpass characteristics having different pass bands from each other in accordance with whether the first switch and the second switch are in a conductive state or a non-conductive state. For example, in the case where the first switch and the second switch are in a conductive state, the first impedance element and the second impedance element are short-circuited by the first switch and the second switch, and a first bandpass characteristic is generated in which there is no effect from the first impedance element and the second impedance element. On the other hand, in the case where the first switch and the second switch are in a non-conductive state, a second bandpass characteristic is generated that is different from the first bandpass characteristic and in which there is an effect from the first impedance element and the second impedance element.

Furthermore, the pass bands of the first bandpass characteristic and the second bandpass characteristic are formed by an anti-resonant frequency of the first parallel arm resonance circuit and an anti-resonant frequency of the second parallel arm resonance circuit. Specifically, the pass bands are formed by anti-resonant frequencies of the first parallel arm resonator of the first parallel arm resonance circuit and the second parallel arm resonator of the second parallel arm resonance circuit. On the other hand, an attenuation band on the low-frequency side of the pass band in the first bandpass characteristic and the second bandpass characteristic is formed by a resonant frequency of the first parallel arm resonance circuit and a resonant frequency of the second parallel arm resonance circuit. Specifically, the attenuation band is formed by the resonant frequencies of the first parallel arm resonator and the second parallel arm resonator.

For example, the attenuation amount of the attenuation band increases as the resonant frequency of the first parallel arm resonance circuit (referred to as first resonant frequency) and the resonant frequency of the second parallel arm resonance circuit (referred to as second resonant frequency) become closer together, and the band width of the attenuation band increases as the first resonant frequency and the second resonant frequency become more spaced apart. In order to bring the first resonant frequency and the second resonant frequency closer together or further apart, for example, designing the resonators such that the resonant frequencies of the first parallel arm resonator and the second parallel arm resonator are frequencies that are close together or frequencies that are spaced apart may be considered. However, since the first parallel arm resonator and the second parallel arm resonator are to be designed such that the anti-resonant frequencies thereof form the desired pass band, it is difficult to make the resonant frequencies thereof match with the desired frequencies.

Here, when the first switch and the second switch are switched from a non-conductive state to a conductive state in the case where the first impedance element and the second impedance element are capacitors or when the first switch and the second switch are switched from a conductive state to a non-conductive state in the case where the first impedance element and the second impedance element are inductors, the first resonant frequency is shifted toward the low-frequency side in accordance with the inductance value of the first inductor (referred to as first inductance value) and the second resonant frequency is shifted toward the low-frequency side in accordance with the inductance value of the second inductor (referred to as second inductance value). In other words, the first resonant frequency and the second resonant frequency when the first switch and the second switch are in a conductive state or a non-conductive state can be set to the desired frequencies by making the first inductance value and the second inductance value different from each other. In other words, the first resonant frequency and the second resonant frequency can be brought closer together or moved further apart in accordance with the extent to which the first inductance value and the second inductance value are made different from each other, and a desired pass band can be formed using the anti-resonant frequencies of the first parallel arm resonator and the second parallel arm resonator. Therefore, according to this embodiment, the attenuation band width can be increased when the frequency of the pass band and the frequency of the attenuation band are switched to lower frequencies.

In addition, the acoustic wave filter device may further include: a third parallel arm resonance circuit that is connected in parallel with the first parallel arm resonance circuit between the first node and ground; and a fourth parallel arm resonance circuit that is connected in parallel with the second parallel arm resonance circuit between the second node and ground. The third parallel arm resonance circuit may include a third parallel arm resonator that is connected to the first node. The fourth parallel arm resonance circuit may include a fourth parallel arm resonator that is connected to the second node. A resonant frequency of the first parallel arm resonator may be different from a resonant frequency of the third parallel arm resonator. A resonant frequency of the second parallel arm resonator may be different from a resonant frequency of the fourth parallel arm resonator.

According to this configuration, in each of a parallel circuit formed by the first parallel arm resonance circuit and the third parallel arm resonance circuit being connected in parallel with each other and a parallel circuit formed by second parallel arm resonance circuit and the fourth parallel arm resonance circuit being connected in parallel with each other, at least one frequency at which impedance is minimum and at least one frequency at which impedance is maximum are both shifted toward the low-frequency side or the high-frequency side in accordance with whether the switch element is in a conductive state or a non-conductive state. Therefore, in the first bandpass characteristic and the second bandpass characteristic, an attenuation slope defined by the frequency at which impedance is minimum and the frequency at which impedance is maximum in these circuits is shifted toward the low-frequency side or the high-frequency side while maintaining the degree of steepness. Therefore, according to this embodiment, the frequency of a pass band and the frequency of an attenuation band can be switched while suppressing an increase in insertion loss inside the pass band in accordance with switching of the switch elements between a conductive state and a non-conductive state.

Furthermore, the resonant frequency of the first parallel arm resonator may be higher than the resonant frequency of the third parallel arm resonator, and the resonant frequency of the second parallel arm resonator may be higher than the resonant frequency of the fourth parallel arm resonator.

According to this configuration, a tunable filter can be provided that, as well as being able to switch the frequency of an attenuation pole on the high-frequency side of the pass band in accordance with switching of the switch elements between a conductive state and a non-conductive state, can suppress an increase in insertion loss at the high-frequency end of the pass band.

Furthermore, the resonant frequency of the first parallel arm resonator may be lower than the resonant frequency of the third parallel arm resonator, and the resonant frequency of the second parallel arm resonator may be lower than the resonant frequency of the fourth parallel arm resonator.

According to this configuration, a tunable filter can be provided that, as well as being able to switch the frequency of an attenuation pole on the low-frequency side of the pass band in accordance with switching of the switch elements between a conductive state and a non-conductive state, can suppress an increase in insertion loss at the low-frequency end of the pass band.

In addition, the third parallel arm resonance circuit may further include a pair of elements consisting of a third impedance element and a third switch, which are connected in parallel with each other, that is connected in series with the third parallel arm resonator between the first node and ground, and a third inductor that is provided on a path that connects the first node and ground to each other via the third switch. The fourth parallel arm resonance circuit may further include a pair of elements consisting of a fourth impedance element and a fourth switch, which are connected in parallel with each other, that is connected in series with the fourth parallel arm resonator between the second node and ground, and a fourth inductor that is provided on a path that connects the second node and ground to each other via the fourth switch.

According to this configuration, a tunable filter can be provided that, as well as being able to switch the frequencies of attenuation poles on the high-frequency side of the pass band and the low-frequency side of the pass band in accordance with switching of the switch elements between a conductive state and a non-conductive state, can suppress an increase in insertion loss at the high-frequency end of the pass band and the low-frequency end of the pass band. Therefore, for example, the tunable filter can shift the center frequency of the pass band while maintaining the band width of the pass band.

In addition, an inductance value of the third inductor and an inductance value of the fourth inductor may be different from each other.

According to this configuration, the band width and attenuation amount of an attenuation band can be increased at both the high-frequency side of the pass band and the low-frequency side of the pass band in accordance with switching of the switch elements between a conductive state and a non-conductive state.

In addition, the acoustic wave filter device may further include: a third parallel arm resonator that is connected in parallel with the first parallel arm resonator between the first node and ground; and a fourth parallel arm resonator that is connected in parallel with the second parallel arm resonator between the second node and ground. The pair of elements consisting of the first impedance element and the first switch, which are connected in parallel with each other, may be connected in series with a circuit in which the first parallel arm resonator and the third parallel arm resonator are connected in parallel with each other. The pair of elements consisting of the second impedance element and the second switch, which are connected in parallel with each other, may be connected in series with a circuit in which the second parallel arm resonator and the fourth parallel arm resonator are connected in parallel with each other. A resonant frequency of the first parallel arm resonator may be different from a resonant frequency of the third parallel arm resonator. A resonant frequency of the second parallel arm resonator may be different from a resonant frequency of the fourth parallel arm resonator.

According to this configuration, a tunable filter can be provided that can switch the frequencies of poles (attenuation poles) at both sides of the pass band together in accordance with switching of the switch elements between a conductive state and a non-conductive state.

Furthermore, the first inductor may be a first wiring line on a path that connects the first parallel arm resonator and ground to each other via the first switch, and the second inductor may be a second wiring line on a path that connects the second parallel arm resonator and ground to each other via the second switch.

For example, in the case where the first parallel arm resonator and the second parallel arm resonator and the first switch and the second switch are mounted on a substrate as different components, a first wiring line that connects the first parallel arm resonator and the first switch to each other and a second wiring line that connects the second parallel arm resonator and the second switch to each other may be provided on the substrate. In other words, since a first wiring line and a second wiring line that are connected between components can be used as the first inductor and the second inductor, the first inductor and the second inductor can be easily realized.

Furthermore, a length of the first wiring line and a length of the second wiring line may be different from each other.

According to this configuration, the first inductance value and the second inductance value can be easily made different from each other by making the length of the first wiring line and the length of the second wiring line different from each other.

Furthermore, a width of the first wiring line and a width of the second wiring line may be different from each other.

According to this configuration, the first inductance value and the second inductance value can be easily made different from each other by setting the line width of the first wiring line and the line width of the second wiring line to different widths.

Furthermore, the first input/output terminal may be a terminal to which a power is inputted that is higher than a radio-frequency power inputted to the second input/output terminal, the first impedance element and the second impedance element may be capacitors, and an inductance value of the first inductor may be smaller than an inductance value of the second inductor.

Power consumption from a radio-frequency signal inputted to the first input/output terminal is likely to be higher in an element that is close to the first input/output terminal to which a power is inputted that is higher than a radio-frequency power inputted to the second input/output terminal among the elements constituting the acoustic wave filter device. In other words, the power consumption of the first switch in the first parallel arm resonance circuit connected to the first node that is close to the first input/output terminal is likely to be large and consequently it would be necessary to use a switch having a high electric power handling capability as the first switch. With respect to this, in the case where the first impedance element and the second impedance element are capacitors, the voltage acting on the first switch is proportional to the first inductance value. Therefore, as a result of making the first inductance value smaller than the second inductance value, the voltage acting on the first switch is low, the power consumption of the first switch can be made smaller, and therefore an electric power handling characteristic can be improved.

In addition, the first input/output terminal may be a terminal to which a power is inputted that is higher than a radio-frequency power inputted to the second input/output terminal. The first impedance element and the second impedance element may be inductors. The first inductor may be connected between the first parallel arm resonator and a circuit in which the first impedance element and the first switch are connected in parallel with each other. The second inductor may be connected between the second parallel arm resonator and a circuit in which the second impedance element and the second switch are connected in parallel with each other. An inductance value of the first inductor may be larger than an inductance value of the second inductor.

In the case where the first impedance element and the second impedance element are inductors and the first inductor is connected between the first parallel arm resonator and a circuit in which the first impedance element and the first switch are connected in parallel with each other, the voltage acting on the first switch is inversely proportional to the first inductance value. Therefore, as a result of making the first inductance value larger than the second inductance value, the voltage acting on the first switch is low, the power consumption of the first switch can be made smaller, and therefore an electric power handling characteristic can be improved.

In addition, the first input/output terminal may be a terminal to which a power is inputted that is higher than a radio-frequency power inputted to the second input/output terminal. The first impedance element and the second impedance element may be inductors. A circuit in which the first inductor and the first switch are connected in series with each other may be connected in parallel with the first impedance element. A circuit in which the second inductor and the second switch are connected in series with each other may be connected in parallel with the second impedance element. An inductance value of the first inductor may be smaller than an inductance value of the second inductor.

In the case where the first impedance element and the second impedance element are inductors and a circuit in which the first inductor and the first switch are connected in series with each other is connected in parallel with the first impedance element, the voltage acting on the first switch is proportional to the first inductance value. Therefore, as a result of making the first inductance value smaller than the second inductance value, the voltage acting on the first switch is low, the power consumption of the first switch can be made smaller, and therefore an electric power handling characteristic can be improved.

In addition, the acoustic wave filter device may further include: a second series arm resonance circuit that is provided on a path that connects the first series arm resonance circuit and the second input/output terminal to each other; and a fifth parallel arm resonance circuit that is connected between a node, which is provided on a path that connects the first series arm resonance circuit and the second series arm resonance circuit to each other, and ground. The second node may be located on a path that connects the second series arm resonance circuit and the second input/output terminal to each other. The fifth parallel arm resonance circuit may include a fifth parallel arm resonator that is connected to a node between the first node and the second node, a pair of elements consisting of a fifth impedance element and a fifth switch, which are connected in parallel with each other, that is connected in series with the fifth parallel arm resonator between that node and ground, and a fifth inductor that is provided on a path that connects that node and ground to each other via the fifth switch. The fifth impedance element may be a capacitor. The inductance value of the first inductor and the inductance value of the second inductor may be smaller than an inductance value of the fifth inductor.

In the case where the first impedance element, the second impedance element, and the fifth impedance element are capacitors, the voltage acting on the first switch is proportional to the first inductance value and the voltage acting on the second switch is proportional to the second inductance value. Therefore, since the power consumption of the first switch and the second switch can be reduced by making the first inductance value and the second inductance value smaller than the inductance value of the fifth inductor (referred to as fifth inductance value), it is possible to improve the electric power handling capability or reduce an intermodulation distortion characteristic at the first input/output terminal and the second input/output terminal.

In addition, the acoustic wave filter device may further include: a second series arm resonance circuit that is provided on a path that connects the first series arm resonance circuit and the second input/output terminal to each other; and a fifth parallel arm resonance circuit that is connected between a node, which is provided on a path that connects the first series arm resonance circuit and the second series arm resonance circuit to each other, and ground. The second node may be located on a path that connects the second series arm resonance circuit and the second input/output terminal to each other. The fifth parallel arm resonance circuit may include a fifth parallel arm resonator that is connected to a node between the first node and the second node, a pair of elements consisting of a fifth impedance element and a fifth switch, which are connected in parallel with each other, that is connected in series with the fifth parallel arm resonator between that node and ground, and a fifth inductor that is connected between that node and a circuit in which the fifth impedance element and the fifth switch are connected in parallel with each other. The fifth impedance element may be an inductor. The inductance value of the first inductor and the inductance value of the second inductor may be larger than an inductance value of the fifth inductor.

In the case where the first impedance element, the second impedance element, and the fifth impedance element are inductors, the first inductor is connected between the first parallel arm resonator and a circuit in which the first impedance element and the first switch are connected in parallel with each other, and the second inductor is connected between the second parallel arm resonator and a circuit in which the second impedance element and the second switch are connected in parallel with each other, the voltage acting on the first switch is inversely proportional to the first inductance value and the voltage acting on the second switch is inversely proportional to the second inductance value. Therefore, since the power consumption of the first switch and the second switch can be reduced by making the first inductance value and the second inductance value larger than the fifth inductance value, it is possible to improve the electric power handling capability or reduce an intermodulation distortion characteristic at the first input/output terminal and the second input/output terminal.

In addition, the acoustic wave filter device may further include: a second series arm resonance circuit that is provided on a path that connects the first series arm resonance circuit and the second input/output terminal to each other; and a fifth parallel arm resonance circuit that is connected between a node, which is provided on a path that connects the first series arm resonance circuit and the second series arm resonance circuit to each other, and ground. The second node may be located on a path that connects the second series arm resonance circuit and the second input/output terminal to each other. The fifth parallel arm resonance circuit may include a fifth parallel arm resonator that is connected to a node between the first node and the second node, a pair of elements consisting of a fifth impedance element and a fifth switch, which are connected in parallel with each other, that is connected in series with the fifth parallel arm resonator between that node and ground, and a fifth inductor that is connected in series with the fifth switch. A circuit in which the fifth switch and the fifth inductor are connected in series with each other may be connected in parallel with the fifth impedance element. The fifth impedance element may be an inductor. The inductance value of the first inductor and the inductance value of the second inductor may be smaller than an inductance value of the fifth inductor.

In the case where the first impedance element, the second impedance element, and the fifth impedance element are inductors, a circuit in which the first inductor and the first switch are connected in series with each other is connected in parallel with the first impedance element, and a circuit in which the second inductor and the second switch are connected in series with each other is connected in parallel with the second impedance element, the voltage acting on the first switch is proportional to the first inductance value and the voltage acting on the second switch is proportional to the second inductance value. Therefore, since the power consumption of the first switch and the second switch can be reduced by making the first inductance value and the second inductance value smaller than the fifth inductance value, it is possible to improve the electric power handling capability or reduce an intermodulation distortion characteristic at the first input/output terminal and the second input/output terminal.

A multiplexer according to an embodiment of the present disclosure includes: a common terminal; a transmission terminal; a reception terminal; a transmission filter provided on a path that connects the common terminal and the transmission terminal to each other; and a reception filter provided on a path that connects the common terminal and the reception terminal to each other. The transmission filter is one of the acoustic wave filter devices described above, the first input/output terminal is connected to the transmission terminal, and the second input/output terminal is connected to the common terminal.

In a multiplexer, power consumption is large at an element that is close to the transmission terminal to which a radio-frequency transmission signal is inputted, and therefore the electric power handling characteristic can be improved by minimizing the power consumption of the first switch as described above. Furthermore, in this embodiment, the second input/output terminal, which is an antenna common terminal, is both a terminal from which a radio-frequency transmission signal is outputted and a terminal to which a radio-frequency reception signal is inputted, and therefore there is an issue in that intermodulation distortion worsens when the power consumption of the second switch in the second parallel arm resonance circuit connected to the second node that is close to the antenna common terminal is large. With respect to this issue, the intermodulation distortion generated at the second switch can be reduced by making the power consumption of the second switch smaller than the power consumption of the fifth switch as described above. In other words, as well as it being possible to provide a multiplexer in which the electric power handling capability of a transmission terminal is prioritized, an intermodulation distortion characteristic at an antenna common terminal can also be reduced.

A multiplexer according to an embodiment of the present disclosure includes: a common terminal; a transmission terminal; a reception terminal; a transmission filter provided on a path that connects the common terminal and the transmission terminal to each other; and a reception filter provided on a path that connects the common terminal and the reception terminal to each other. The transmission filter is one of the acoustic wave filter devices described above, the first input/output terminal is connected to the common terminal, and the second input/output terminal is connected to the transmission terminal.

In a multiplexer, power consumption is large at an element that is close to the transmission terminal to which a radio-frequency transmission signal is inputted, and therefore the electric power handling characteristic can be improved by minimizing the power consumption of the second switch as described above. Furthermore, in this embodiment, the first input/output terminal, which is an antenna common terminal, is both a terminal from which a radio-frequency transmission signal is outputted and a terminal to which a radio-frequency reception signal is inputted, and therefore there is an issue in that intermodulation distortion worsens when the power consumption of the first switch in the first parallel arm resonance circuit connected to the first node that is close to the antenna common terminal is large. With respect to this issue, the intermodulation distortion generated at the first switch can be reduced by making the power consumption of the first switch smaller than the power consumption of the fifth switch as described above. In other words, as well as it being possible to provide a multiplexer in which the electric power handling capability of a transmission terminal is prioritized, an intermodulation distortion characteristic at an antenna common terminal can also be reduced.

Furthermore, a radio-frequency front end circuit according to an embodiment of the present disclosure includes: one of the acoustic wave filter devices or one of the multiplexers described above; and an amplification circuit.

According to this configuration, a radio-frequency front end circuit can be provided that can increase the attenuation band width when the frequency of the pass band and the frequency of an attenuation band are switched to lower frequencies.

In addition, a communication device according to an embodiment of the present disclosure includes: an RF signal processing circuit that processes a radio-frequency signal transmitted or received by an antenna element; and the above-described radio-frequency front end circuit, which transmits the radio-frequency signal between the antenna element and the RF signal processing circuit.

According to this configuration, a communication device can be provided that can increase the attenuation band width when the frequency of the pass band and the frequency of the attenuation band are switched to lower frequencies.

With the acoustic wave filter device and so forth according to the present disclosure, the attenuation band width can be increased when the frequency of the pass band and the frequency of the attenuation band are switched to lower frequencies.

Each of FIGS. 3A and 3B is a diagram schematically illustrating the structure of resonators of embodiment 1.

Figure 4:
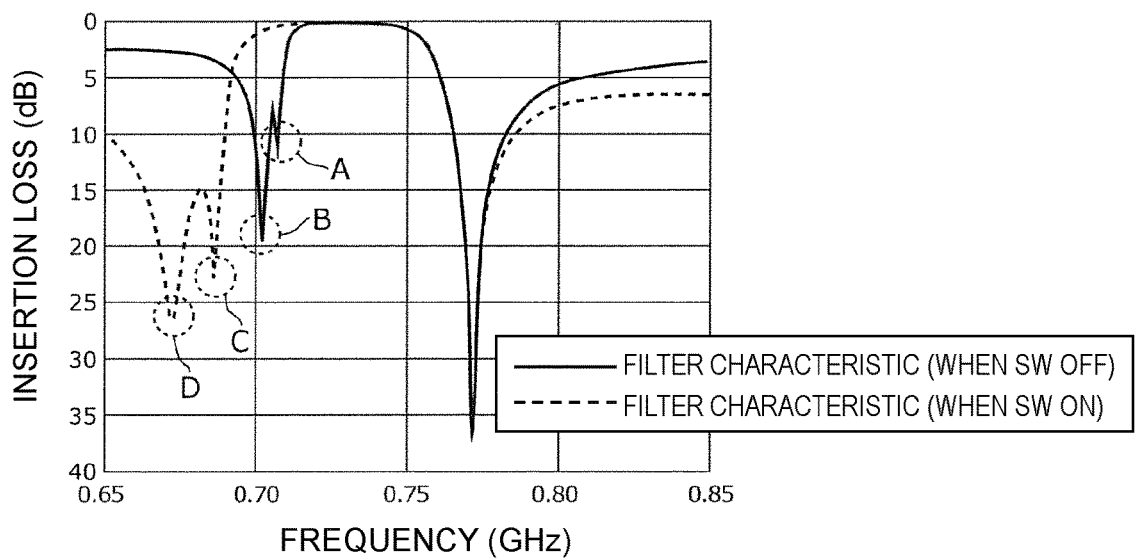

FIG. 4 is a graph illustrating characteristics of the filter according to embodiment 1.

Figure 5:
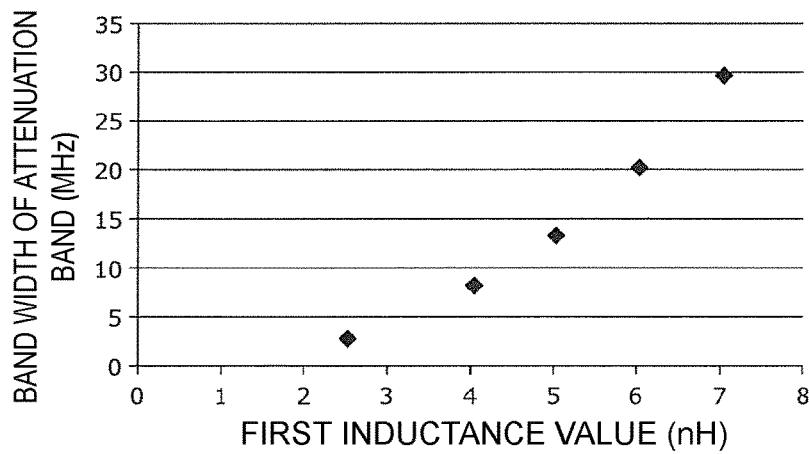

FIG. 5 is a graph illustrating an example of changes in the band width of an attenuation band when the inductance value of a first inductor is changed.

Figure 6:
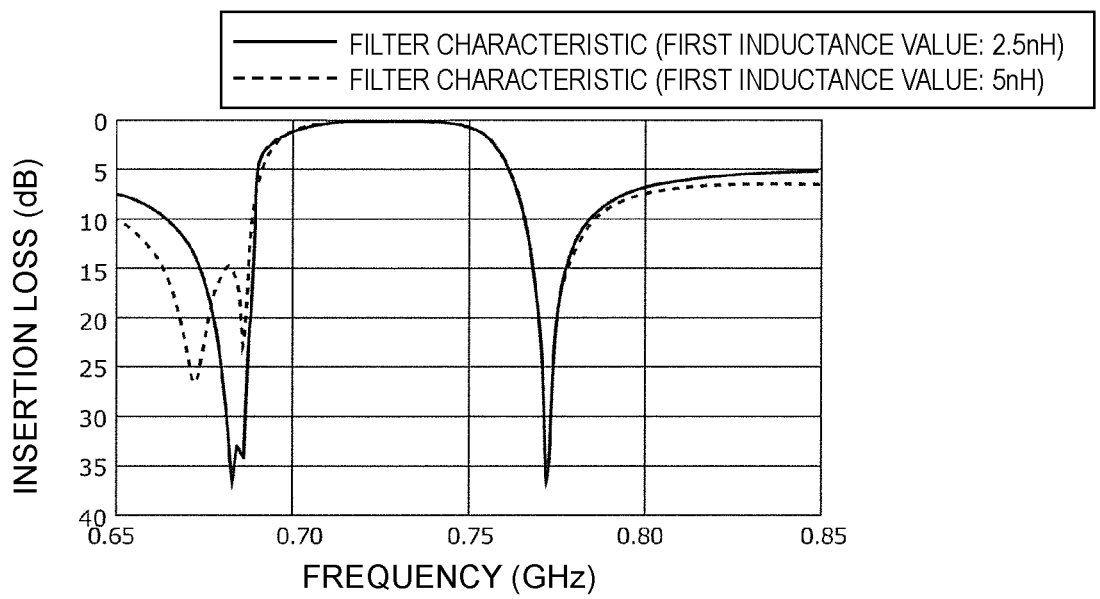

FIG. 6 is a graph illustrating filter characteristics of the filter of embodiment 1 when the inductance value of the first inductor is changed.

Figure 7:
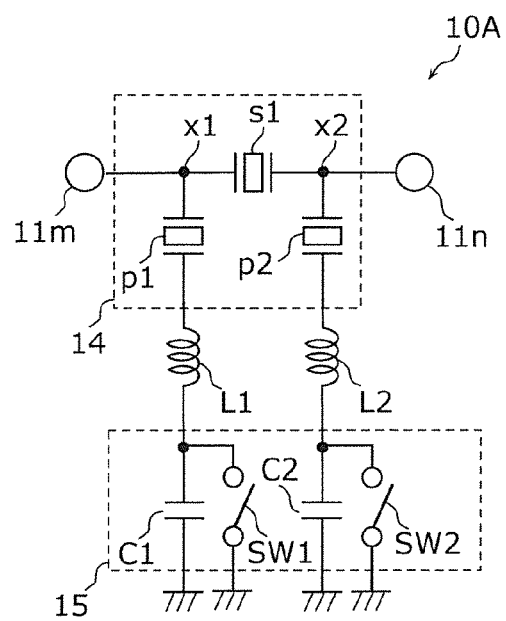

FIG. 7 is a circuit configuration diagram of a filter according to a modification of embodiment 1.

Figure 8:
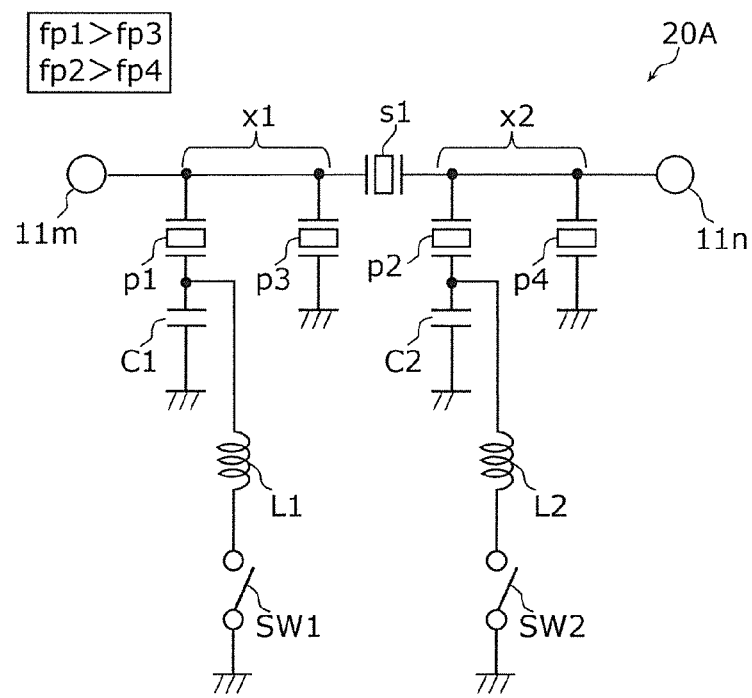

FIG. 8 is a circuit configuration diagram of a filter according to application example 1 of embodiment 2.

FIG. 9A is a circuit configuration diagram of a filter formed of a series arm resonator, a second parallel arm resonance circuit, and a fourth parallel arm resonance circuit in application example 1 of embodiment 2.

FIGS. 9B, 9C and 9D depict graphs illustrating the characteristics of the filter formed of the series arm resonator, the second parallel arm resonance circuit, and the fourth parallel arm resonance circuit in application example 1 of embodiment 2.

Figure 10:
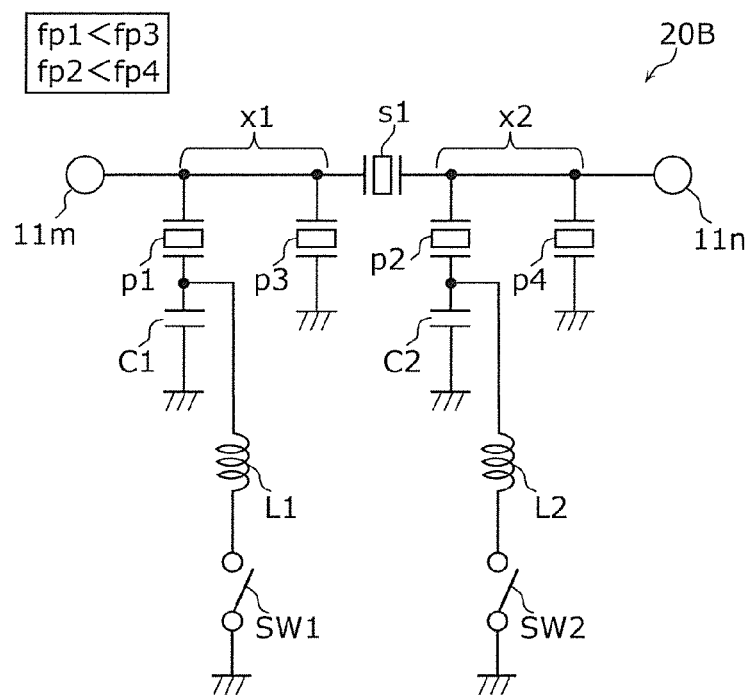

FIG. 10 is a circuit configuration diagram of a filter according to application example 2 of embodiment 2.

Figure 11A:
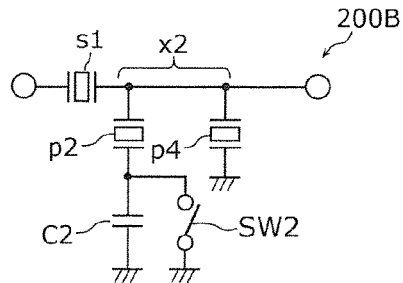

FIG. 11A is a circuit configuration diagram of a filter formed of a series arm resonator, a second parallel arm resonance circuit, and a fourth parallel arm resonance circuit in application example 2 of embodiment 2.

Figure 11B:
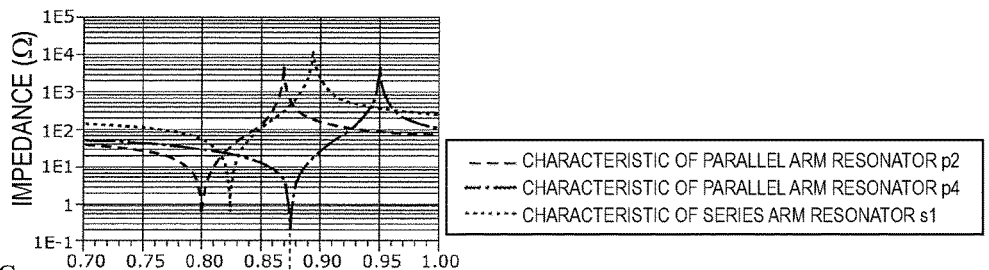
Figure 11C:
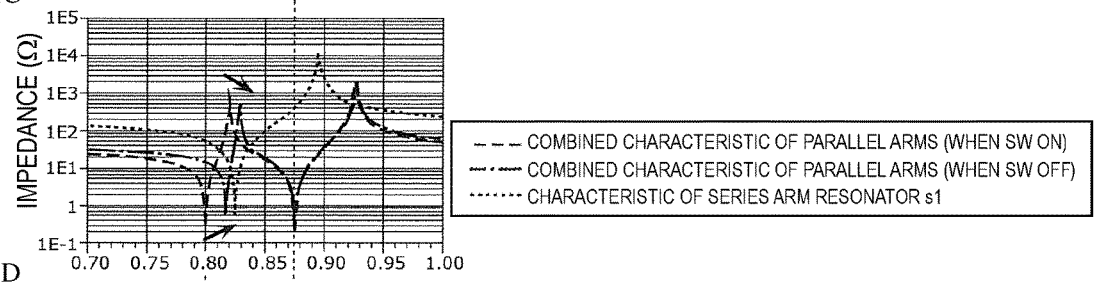
Figure 11D:
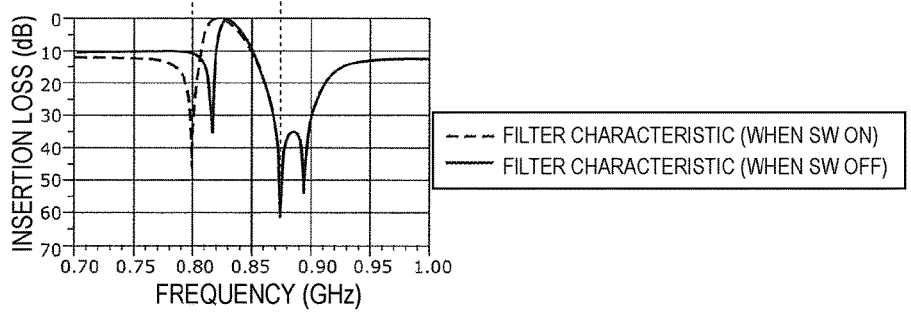

FIGS. 11B, 11C and 11D depict graphs illustrating the characteristics of the filter formed of the series arm resonator, the second parallel arm resonance circuit, and the fourth parallel arm resonance circuit in application example 2 of embodiment 2.

Figure 12:
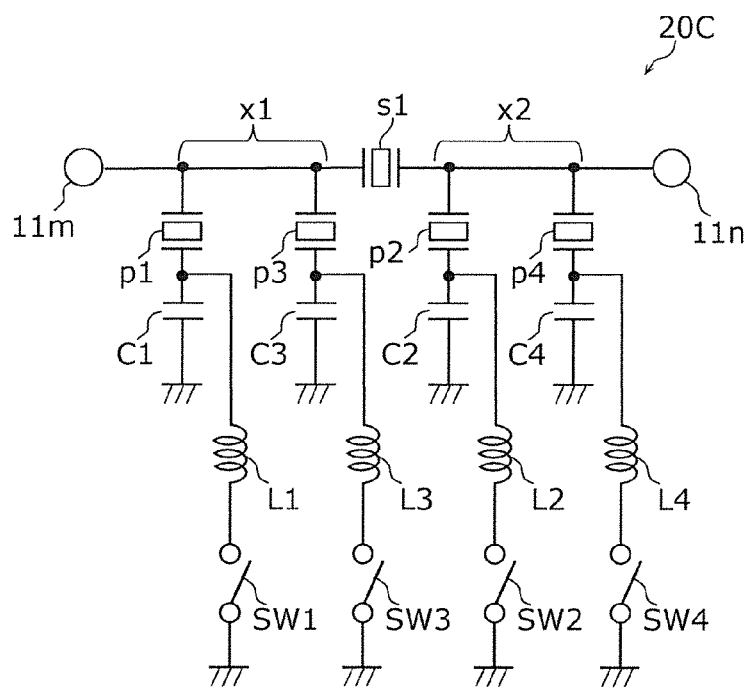

FIG. 12 is a circuit configuration diagram of a filter according to application example 3 of embodiment 2.

Figure 13A:
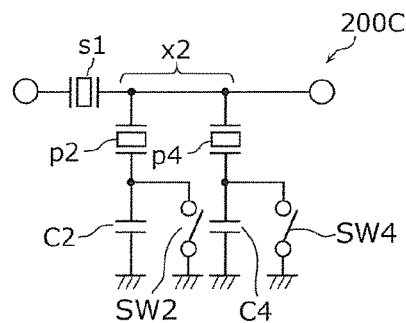

FIG. 13A is a circuit configuration diagram of a filter formed of a series arm resonator, a second parallel arm resonance circuit, and a fourth parallel arm resonance circuit in application example 3 of embodiment 2.

Figure 13B:
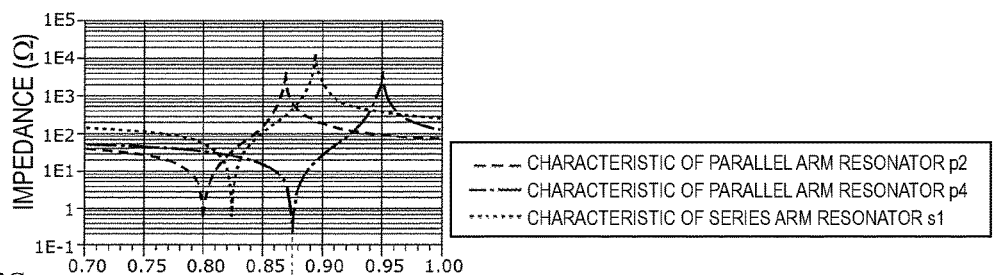
Figure 13C:
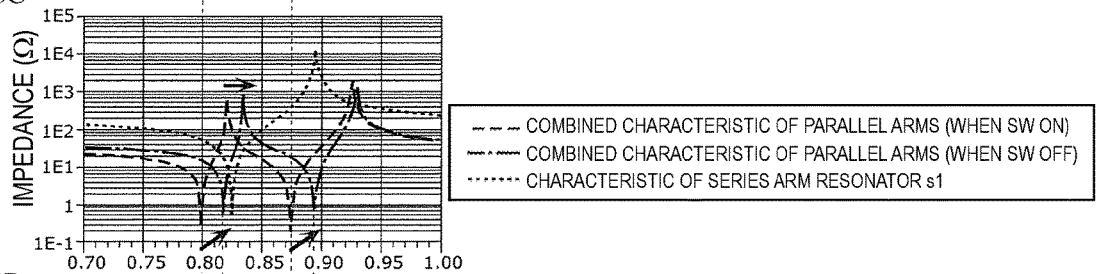
Figure 13D:
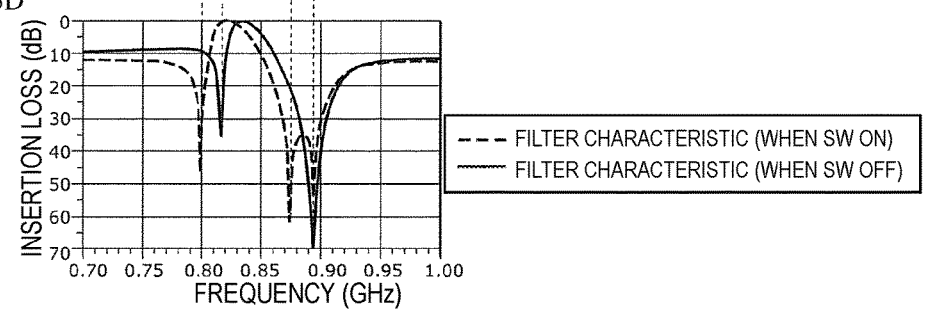

FIGS. 13B, 13C and 13D depict graphs illustrating the characteristics of the filter formed of the series arm resonator, the second parallel arm resonance circuit, and the fourth parallel arm resonance circuit in application example 3 of embodiment 2.

Figure 14:
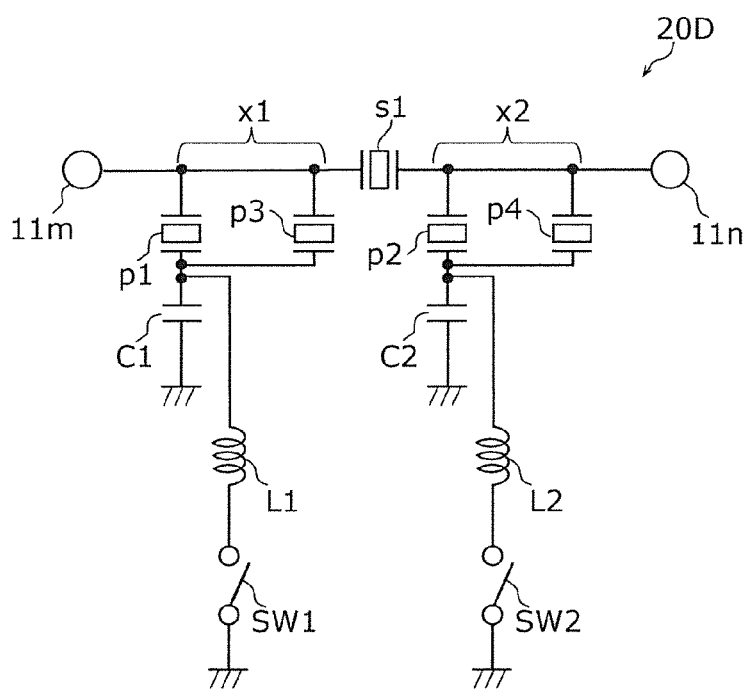

FIG. 14 is a circuit configuration diagram of a filter according to application example 4 of embodiment 2.

Figure 15A:
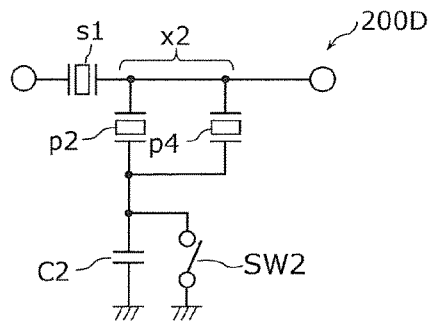

FIG. 15A is a circuit configuration diagram of a filter formed of a series arm resonator and a second parallel arm resonance circuit in application example 4 of embodiment 2.

Figure 15B:
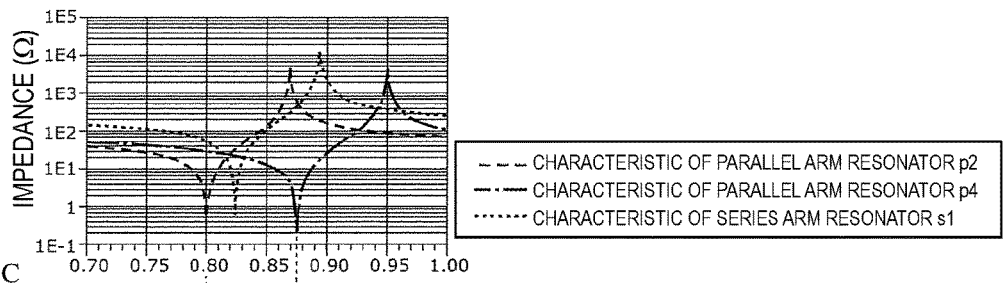
Figure 15C:
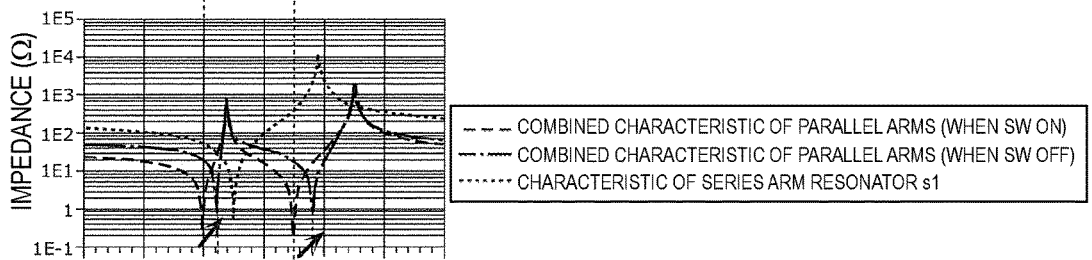
Figure 15D:
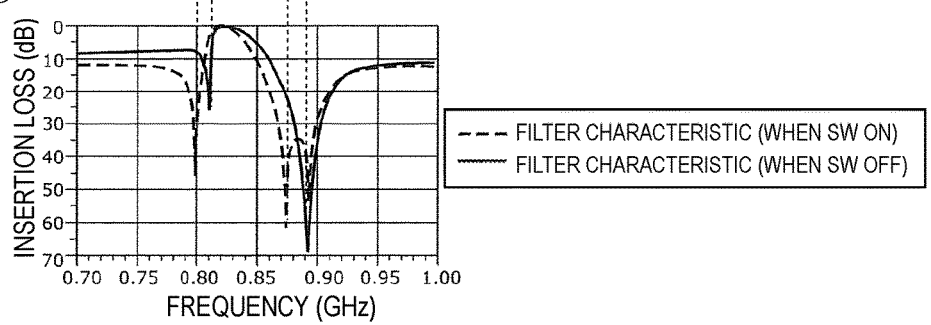

FIGS. 15B, 15C and 15D depict graphs illustrating characteristics of the filter formed of the series arm resonator and the second parallel arm resonance circuit in application example 4 of embodiment 2.

Figure 16:
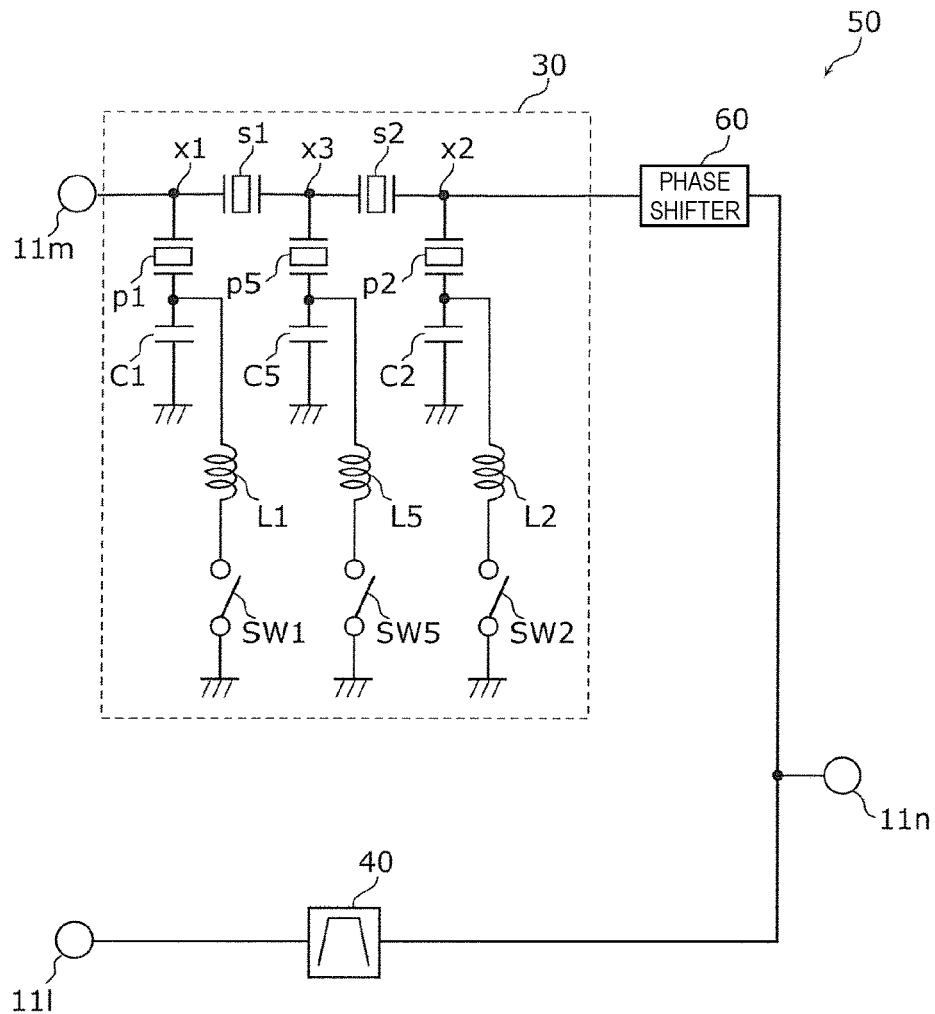

FIG. 16 is a circuit configuration diagram of a multiplexer according to embodiment 3.

Figure 17:
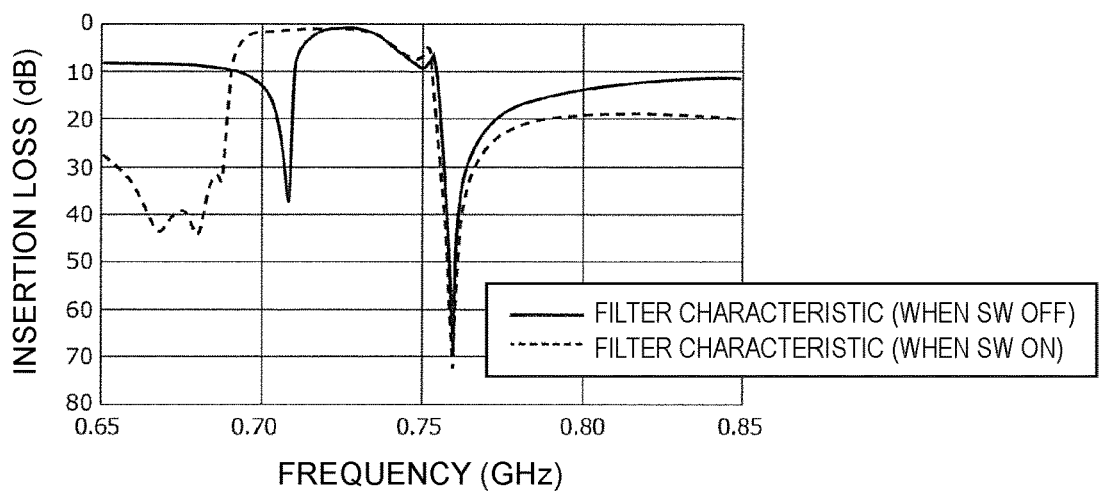

FIG. 17 is a graph illustrating the filter characteristics of a filter of embodiment 3 when the switches are in a conductive state and a non-conductive state.

Figure 18:
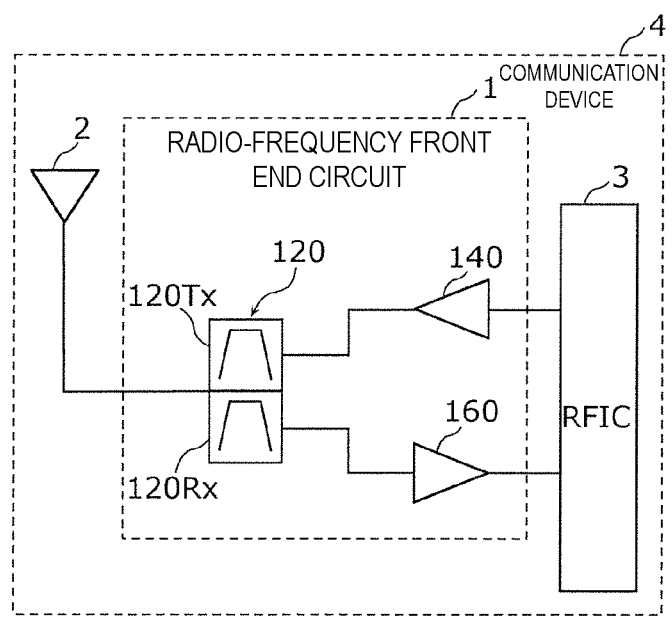

FIG. 18 is a configuration diagram of a radio-frequency front end circuit according to embodiment 4 and the circuit peripherals thereof.

Figure 19:
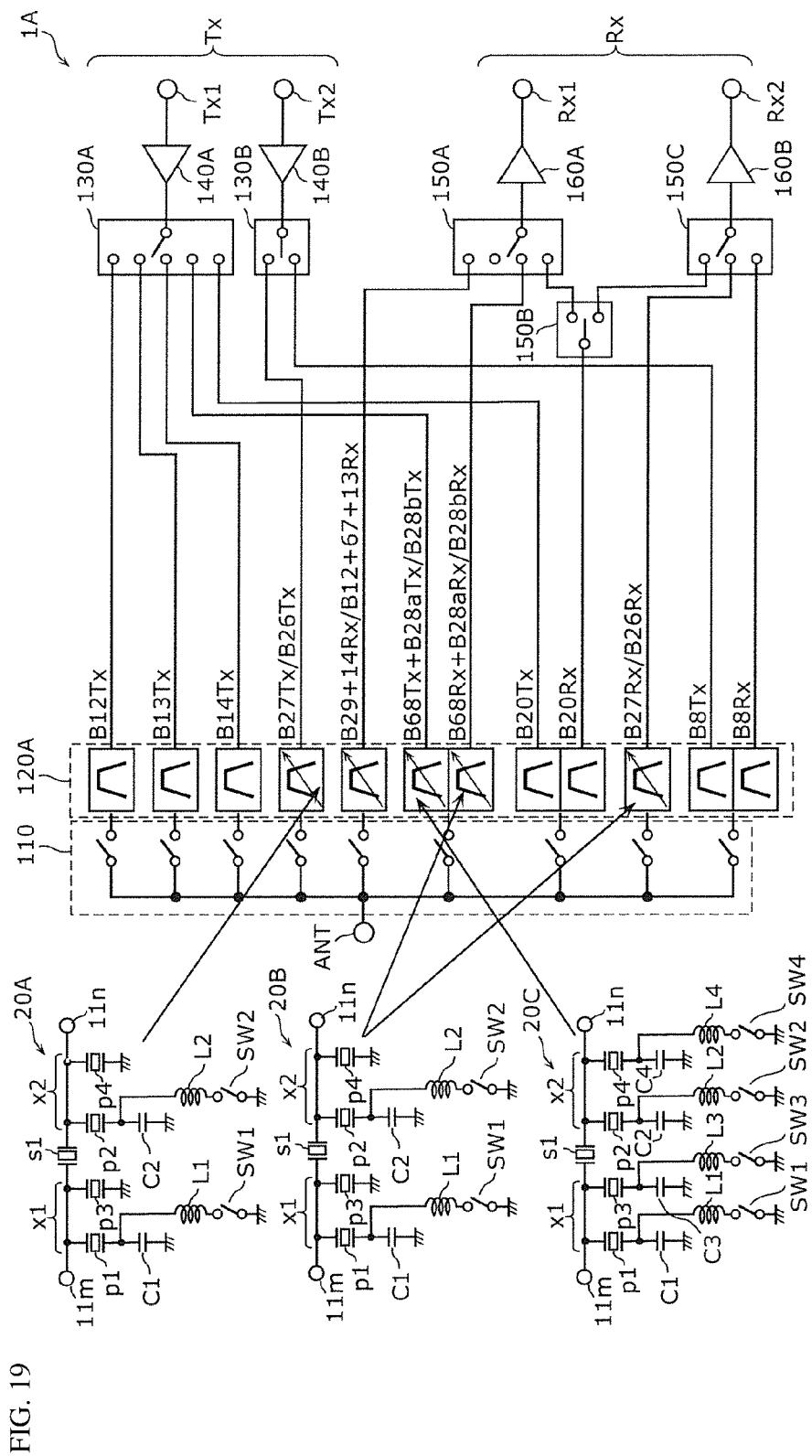

FIG. 19 is a configuration diagram of a radio-frequency front end circuit according to a modification of embodiment 4.

DETAILED DESCRIPTION OF THE DISCLOSURE

Hereafter, embodiments of the present disclosure will be described in detail using the examples and the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure. Constituent elements not described in the independent claims among constituent elements in the following embodiments are described as arbitrary constituent elements. In addition, the sizes of the constituent elements illustrated in the drawings or the ratios between the sizes are not necessarily strictly accurate. Furthermore, in the drawings, configurations that are substantially the same as each other may be denoted by the same symbols and repeated description thereof may be omitted or simplified.

In addition, hereafter, "the low-frequency end of the pass band" refers to "the lowest frequency inside the pass band". Furthermore, "the high-frequency end of the pass band" refers to "the highest frequency inside the pass band". In addition, "the low-frequency side of the pass band" refers to "frequencies that are outside the pass band and lower than the pass band". Furthermore, "the high-frequency side of the pass band" refers to "frequencies that are outside the pass band and higher than the pass band". In addition, hereafter, "the side located at low frequencies" may be referred to as "the low-frequency side" and "the side located at high frequencies" may be referred to as "the high-frequency side".

Furthermore, hereafter, switch elements are described as ideal elements in which the impedance is infinite when the switch element is in a conductive (on) state and the impedance is zero when the switch element is in a non-conductive (off) state. In reality, a switch element will have parasitic components such as a capacitive component when the switch element is in a non-conductive state, and an inductance component and a resistive component when the switch element is in a conductive state, and therefore in reality slightly different characteristics will be obtained compared to those obtained when a switch element assumed to be an ideal element is used.

Embodiment 1

[1. Circuit Configuration of Filter]

Figure 1:
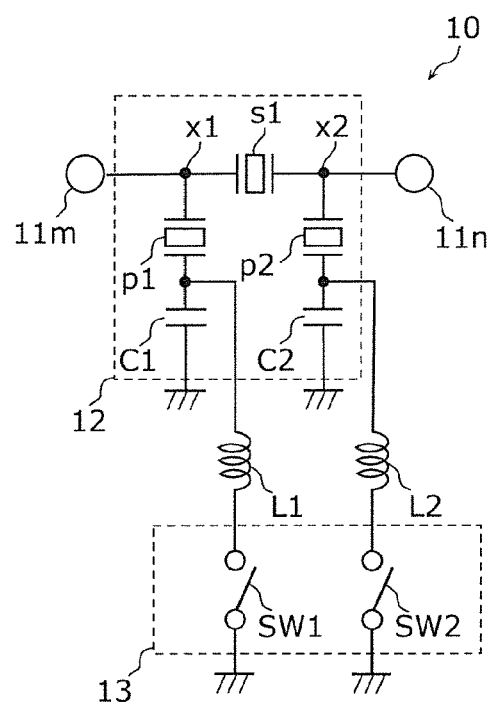
FIG. 1 is a circuit configuration diagram of a filter according to embodiment 1.

FIG. 1 is a circuit configuration diagram of a filter 10 according to embodiment 1.

A filter 10 is a radio-frequency filter circuit that is arranged in a front end unit of a cellular phone that supports multiple modes/multiple bands, for example. The filter 10 is, for example, a band pass filter that is built into a cellular phone that supports multiple bands defined by a communication standard such as long term evolution (LTE), allows a radio-frequency signal of a prescribed band to pass therethrough, and filters out radio-frequency signals that would interfere with communication. The filter 10 is an acoustic wave filter device in which acoustic wave resonators are used.

Furthermore, the filter 10 is a variable-frequency filter (tunable filter) in which the pass band can be changed. As will be described below, the filter 10 has switch elements and the frequency of the pass band can be switched in accordance with whether the switch elements are in a conductive state or a non-conductive state. Here, the switch elements are switched between being in a conductive state and a non-conductive state in accordance with a control signal from a control unit such as a radio frequency integrated circuit (RFIC).

As illustrated in the figure, the filter 10 includes: a series arm resonator s1, a parallel arm resonator p1, a capacitor C1, an inductor L1, a switch SW1, a parallel arm resonator p2, a capacitor C2, an inductor L2, and a switch SW2.

The series arm resonator s1 is a first series arm resonance circuit that is provided on a path that connects an input/output terminal 11m (first input/output terminal) and an input/output terminal 11n (second input/output terminal) to each other. In other words, the series arm resonator s1 is a resonator that is provided on a path that connects the input/output terminal 11m and the input/output terminal 11n to each other. For example, the input/output terminal 11m is a terminal to which a radio-frequency power is inputted that is higher than a radio-frequency power inputted to the input/output terminal 11n. Specifically, the input/output terminal 11m is an input terminal to which a radio-frequency signal is inputted and the input/output terminal 11n is an output terminal from which a radio-frequency signal is outputted. In addition, a series arm resonance circuit includes a series arm resonator(s) and the series arm resonator(s) includes one or more acoustic wave resonators. The series arm resonance circuit may be a resonance circuit that is formed of inductors and capacitors and has a resonant frequency and an anti-resonant frequency as represented by the Butterworth Van Dyke (BVD) model of a resonator. In this embodiment, the series arm resonance circuit is formed of one acoustic wave resonator, but may instead be formed of acoustic wave resonators divided into series or parallel resonators or a longitudinal coupling resonator formed of a plurality of acoustic wave resonators. In the case where acoustic wave resonators that are divided into series and parallel resonators are used, the electric power handling capability of the filter can be improved. In the case of a filter that uses a longitudinal coupling resonator, it is possible to more easily adjust the filter to required filter characteristics such as attenuation intensity.

The parallel arm resonator p1 is a first parallel arm resonator that is connected between a first node (node x1 in FIG. 1) that is on the input/output terminal 11m side of the series arm resonator s1 and ground (reference terminal) among nodes on the path that connects the input/output terminal 11m and the input/output terminal 11n to each other. In other words, the parallel arm resonator p1 is a resonator that is provided in a parallel arm resonance circuit that connects the node x1 on the series arm and ground to each other. In this embodiment, the node x1 is a node that is on the input/output terminal 11m side of the series arm resonator s1.

The parallel arm resonator p2 is a second parallel arm resonator that is connected between a second node (node x2 in FIG. 1) that is on the input/output terminal 11n side of the series arm resonator s1 and ground among the nodes on the path that connects the input/output terminal 11m and the input/output terminal 11n to each other. In other words, the parallel arm resonator p2 is a resonator that is provided in a parallel arm resonance circuit that connects the node x2 on the series arm and ground to each other. In this embodiment, the node x2 is a node that is on the input/output terminal 11n side of the series arm resonator s1.

Hereafter, for convenience, a singular point where the impedance of a resonator or a resonance circuit is minimum (ideally, a point where the impedance is 0) will be referred to as a "resonant frequency". In addition, a singular point where the impedance is maximum (ideally, a point where the impedance is infinite) will be referred to as an "anti-resonant frequency".

The series arm resonator s1 and the parallel arm resonators p1 and p2 are acoustic wave resonators that have resonant frequencies and anti-resonant frequencies, and are each formed of a surface acoustic wave (SAW) resonator, a bulk acoustic wave (BAW) resonator, or a film bulk acoustic resonator (FBAR). Here, the series arm resonator s1 and the parallel arm resonators P1 to P2 are each formed of a surface acoustic wave resonator. Consequently, the filter 10 can be formed using interdigital transducer (IDT) electrodes formed on a substrate having piezoelectricity, and therefore a small-sized low-profile filter circuit can be realized that has a bandpass characteristic with a high degree of steepness. A substrate having piezoelectricity is a substrate having piezoelectricity at at least the surface thereof. For example, the substrate may have a piezoelectric thin film at the surface thereof, and may be formed of multilayer body consisting of the piezoelectric thin film, a film having a different acoustic velocity, a support substrate, and so on. In addition, for example, the substrate may be a multilayer body consisting of a high-acoustic-velocity support substrate and a piezoelectric thin film formed on the high-acoustic-velocity support substrate, a multilayer body consisting of a high-acoustic-velocity support substrate, a low-acoustic-velocity film formed on the high-acoustic-velocity support substrate, and a piezoelectric thin film formed on the low-acoustic-velocity film, or a multilayer body consisting of a support substrate, a high-acoustic-velocity film formed on the support substrate, a low-acoustic-velocity film formed on the high-acoustic-velocity film, and a piezoelectric thin film formed on the low-acoustic-velocity film. The substrate may instead have piezoelectricity throughout the entirety thereof.

The parallel arm resonators p1 and p2 are designed such that anti-resonant frequencies thereof are located inside the pass band of the filter 10 and the resonant frequencies thereof are located on the low-frequency side of the pass band. The series arm resonator s1 is designed such that the resonant frequency thereof is located inside the pass band of the filter 10 and the anti-resonant frequency thereof is located on the high-frequency side of the pass band. Thus, the pass band is formed by the anti-resonant frequencies of the parallel arm resonators p1 and p2 and the resonant frequency of the series arm resonator s1, an attenuation pole on the low-frequency side of the pass band is formed by the resonant frequencies of the parallel arm resonators p1 and p2 and an attenuation pole on the high-frequency side of the pass band is formed by the anti-resonant frequency of the series arm resonator s1.

In this embodiment, the capacitor C1 is a first impedance element that is serially connected to the parallel arm resonator p1 and the capacitor C2 is a second impedance element that is serially connected to the parallel arm resonator p2. The variable frequency width of the attenuation pole on the low-frequency side of the pass band of the filter 10 depends on the constants of the capacitors C1 and C2, and for example, the variable frequency width becomes larger as the constants of the capacitors C1 and C2 become smaller. Therefore, the constants of the capacitor C1 and C2 can be appropriately decided upon in accordance with the frequency specifications required for the filter 10. In addition, the capacitors C1 and C2 may be variable capacitors such as varicaps or digitally tunable capacitors (DTC). In this way, it is possible to finely adjust the variable frequency width.

The impedance elements are not limited to capacitors and may instead be inductors, for example. In the case where inductors are used as the impedance elements, the direction in which the pass band is shifted when the switch elements are switched between a conductive state and a non-conductive state is different from that in the case where capacitors are used. Specifically, when the switch elements are switched from the conductive state to the non-conductive state, the low-frequency-side attenuation pole of the pass band is shifted toward the high-frequency side when capacitors are used and is shifted toward the low-frequency side when inductors are used. In addition, the variable frequency width of the pass band will depend on the constants of the inductors, and the variable frequency width will become larger as the constants of the inductors become larger, for example. Therefore, the constants of the inductors can be appropriately decided upon in accordance with the frequency specifications required for the filter 10. Furthermore, in this case, the inductors may be variable inductors that use a micro-electromechanical system (MEMS). In this way, it is possible to finely adjust the variable frequency width.

The switch SW1 is a first switch, has one terminal that is connected to a connection node between the parallel arm resonator p1 and the capacitor C1 and another terminal that is connected to ground, and is, for example, a single-pole single-throw (SPST) switch element. The switch SW2 is a second switch, has one terminal that is connected to a connection node between the parallel arm resonator p2 and the capacitor C2 and another terminal that is connected to ground, and is, for example, SPST switch element. The switches SW1 and SW2 are switched between a conductive state and a non-conductive state using a control signal from a control unit (not illustrated), and as a result paths between the respective connection nodes and ground are put into a conductive or non-conductive state.

For example, the switches SW1 and SW2 may be field effect transistor (FET) switches composed of GaAs or a complementary metal oxide semiconductor (CMOS) or may be diode switches.

The capacitor C1 and the switch SW1 are connected in parallel with each other and thereby form a pair of elements, and the capacitor C1 and the switch SW1 forming this pair of elements are connected in series with the parallel arm resonator p1 between the node x1 and ground. In addition, the capacitor C2 and the switch SW2 are connected in parallel with each other and thereby form a pair of elements, and the capacitor C2 and the switch SW2 forming this pair of elements are connected in series with the parallel arm resonator p2 between the node x2 and ground.

The inductor L1 is a first inductor that is provided on a path that connects the node x1 and ground to each other via the switch SW1. A circuit formed by the inductor L1 and the switch SW1 being connected in series with each other is connected in parallel with the capacitor C1. The inductor L1 is for example a wiring line (first wiring line) on a path that connects the parallel arm resonator p1 and ground to each other via the switch SW1. Specifically, the first wiring line is a wiring line that connects a connection node between the parallel arm resonator p1 and the capacitor C1, and the switch SW1 to each other. The inductor L2 is a second inductor that is provided on a path that connects the node x2 and ground to each other via the switch SW2. A circuit formed by the inductor L2 and the switch SW2 being connected in series with each other is connected in parallel with the capacitor C2. The inductor L2 is for example a wiring line (second wiring line) on a path that connects the parallel arm resonator p2 and ground to each other via the switch SW2. Specifically, the second wiring line is a wiring line that connects a connection node between the parallel arm resonator p2 and the capacitor C2, and the switch SW2 to each other.

In addition, the inductance value of the inductor L1 (referred to as first inductance value) and the inductance value of the inductor L2 (referred to as second inductance value) are different from each other. Specifically, the first inductance value and the second inductance value are different from each other as a result of the length of the first wiring line and the length of the second wiring line being different from each other. "The first inductance value and the second inductance value are different from each other" means that the difference between the first inductance value and the second inductance value is greater than 10%, for example.

The first inductance value of the inductor L1 in a first parallel arm resonance circuit connected to the node x1 that is close to the input/output terminal 11$m$, which is the input terminal, is smaller than the second inductance value. Specifically, the first inductance value is made smaller than the second inductance value by appropriately designing the length, width, or shape of the first wiring line constituting the inductor L1.

The parallel arm resonator p1, the capacitor C1, the switch SW1, and the inductor L1 form the first parallel arm resonance circuit that is connected between the node x1, which is on the path (on the series arm) that connects the input/output terminal 11$m$ and the input/output terminal 11$n$ to each other, and ground. In other words, the first parallel arm resonance circuit is provided in one parallel arm that connects the series arm and ground to each other. The parallel arm resonator p2, the capacitor C2, the switch SW2, and the inductor L2 form a second parallel arm resonance circuit that is connected between the node x2, which is on the path (on the series arm) that connects the input/output terminal 11$m$ and the input/output terminal 11$n$ to each other, and ground. In other words, the second parallel arm resonance circuit is provided in one parallel arm that connects the series arm and ground to each other.

Hereafter, not only in the case of a resonator as a standalone unit, but also in the case of a parallel arm resonance circuit formed of a resonator and an impedance element, for convenience, a singular point where the combined impedance of the resonator and the impedance element is minimum (ideally, a point where the impedance is 0) will be referred to as a "resonant frequency". In addition, a singular point where the combined impedance is maximum (ideally, a point where the impedance is infinite) will be referred to as an "anti-resonant frequency".

As described above, the parallel arm resonators p1 and p2 are designed such that the anti-resonant frequencies thereof are located inside the pass band of the filter 10 and the resonant frequencies are located on the low-frequency side of the pass band of the filter 10, and therefore the anti-resonant frequencies of the first parallel arm resonance circuit and the second parallel arm resonance circuit are located inside the pass band of the filter 10 and the resonant frequencies of the first parallel arm resonance circuit and the second parallel arm resonance circuit are located on the low-frequency side of the pass band of the filter 10. Thus, the pass band is formed by the anti-resonant frequencies of the first parallel arm resonance circuit and the second parallel arm resonance circuit and the resonant frequency of the series arm resonator s1, and the attenuation pole on the low-frequency side of the pass band is formed by the resonant frequencies of the first parallel arm resonance circuit and the second parallel arm resonance circuit.

Furthermore, in the first parallel arm resonance circuit and the second parallel arm resonance circuit, the frequency at which the impedance is minimum is shifted toward the low-frequency side or the high-frequency side in accordance with whether the switches SW1 and SW2 are in a conductive state or a non-conductive state. In other words, the first parallel arm resonance circuit and the second parallel arm resonance circuit can change the frequency of the attenuation pole on the low-frequency side of the pass band of the filter 10. This will be described later in conjunction with the characteristics of the filter 10.

The parallel arm resonators p1 and p2 and the switches SW1 and SW2 are formed in separate chips. Specifically, as illustrated in FIG. 1, for example, the series arm resonator s1, the parallel arm resonators p1 and p2, and the capacitors C1 and C2 are formed in the same chip 12, and the switches SW1 and SW2 are formed in the same chip 13. The chips 12 and 13 are provided on a wiring substrate 16 or inside the wiring substrate 16. The inductor L1 (first wiring line) and the inductor L2 (second wiring line) are provided on the wiring substrate 16 or inside the wiring substrate 16 on which the chip 12 and the chip 13 are mounted. In other words, since the filter 10 is formed of the chips 12 and 13 and the wiring substrate 16 for example, the filter 10 can made small in size.

Figure 2A:
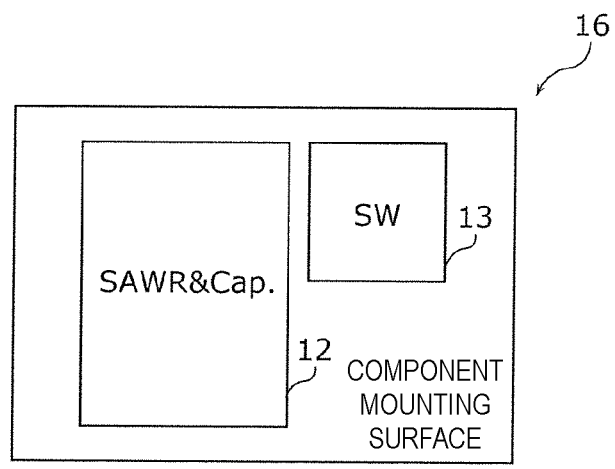
FIG. 2A is a plan view illustrating a component mounting surface of a wiring substrate on which chips that form the filter according to embodiment 1 are mounted.
Figure 2B:
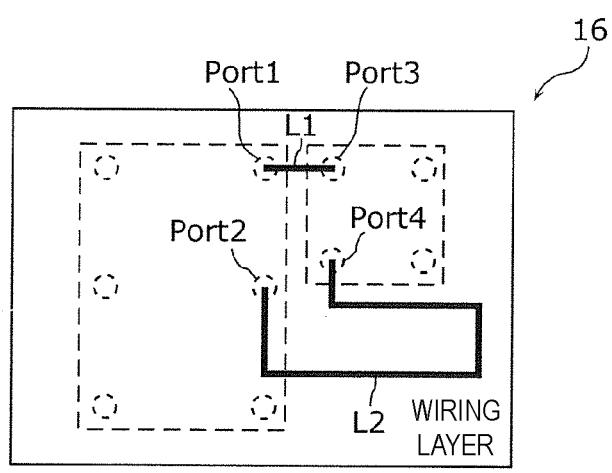
FIG. 2B is a plan view of a wiring layer of the wiring substrate on which the chips that form the filter according to embodiment 1 are mounted.

FIG. 2A is a plan view illustrating a component mounting surface 17 of the wiring substrate 16 on which the chips 12 and 13 constituting the filter 10 according to embodiment 1 are mounted. FIG. 2B is a plan view illustrating a wiring line layer 18 of wiring lines, which connect the chip 12 and the chip 13 to each other, of the wiring substrate 16 on which the chips 12 and 13 constituting the filter 10 according to embodiment 1 are mounted.

As illustrated in FIG. 2A, the chips 12 and 13 are mounted on a substrate. Since the chip 12 and the chip 13 are separate chips, the chip 12 and the chip 13 are connected to each other using wiring lines (for example, pattern wiring lines) as illustrated in FIG. 2B, for example. The outer shapes of the chips 12 and 13 when the substrate is viewed from above and the terminals (bumps) of the chips 12 and 13 are illustrated as broken lines in FIG. 2B. A terminal Port1 of the chip 12 corresponds to a connection node between the parallel arm resonator p1 and the capacitor C1 and a terminal Port2 of the chip 12 corresponds to a connection node between the parallel arm resonator p2 and the capacitor C2. A terminal Port3 of the chip 13 corresponds to a terminal at one end of the switch SW1 (terminal that is not on ground side) and a terminal Port4 of the chip 13 corresponds to a terminal at one end of the switch SW2 (terminal that is not on ground side). Here, the term "wiring lines", for example, refers to elements having inductance components on paths from the parallel arm resonators p1 and p2 formed in the chip 12 to the switches SW1 and SW2 formed in the chip 13, and for example, wiring lines, bumps, and via holes (through holes) in the chips 12 and 13 and wiring lines and via holes in the wiring substrate 16 are included in the meaning of the term "wiring lines". Therefore, along a path from the parallel arm resonator p1 to the switch SW1, the first wiring line includes a wiring line inside the chip 12 or on the chip 12, a bump of the chip 12, a via hole in the wiring substrate 16 connected to the bump of the chip 12, a wiring line inside the wiring substrate 16 or on the wiring substrate 16, a via hole in the wiring substrate 16 that is connected to a bump of the chip 13, the bump of the chip 13, and a wiring line inside the chip 13 or on the chip 13. Similarly, along a path from the parallel arm resonator p2 to the switch SW2, the second wiring line includes a wiring line inside the chip 12 or on the chip 12, a bump of the chip 12, a via hole in the wiring substrate 16 connected to the bump of the chip 12, a wiring line inside the wiring substrate 16 or on the wiring substrate 16, a via hole in the wiring substrate 16 that is connected to a bump of the chip 13, the bump of the chip 13, and a wiring line inside the chip 13 or on the chip 13.

As illustrated in FIG. 2B, the first wiring line, which is the inductor L1, is connected between the terminal Port1 and the terminal Port3, and is provided (routed) such that the first inductance value thereof is smaller than the second inductance value. On the other hand, the second wiring line, which is the inductor L2, is connected between the terminal Port2 and the terminal Port4, and is provided such that the second inductance value thereof is larger than the first inductance value. Here, for example, the first wiring line and the second wiring line have the same width and the first wiring line and the second wiring line are each formed of a single layer, and therefore the length of the first wiring line is shorter than the length of the second wiring line. Alternatively, the width of the first wiring line may be larger than the width of the second wiring line in the case where the first wiring line and the second wiring line have the same length and the first wiring line and the second wiring line are each formed of a single layer. In addition, both the lengths and widths of the first wiring line and the second wiring line may be changed and the first wiring line and the second wiring line may be formed of a plurality of layers with through holes or via holes therebetween, for example.

Furthermore, the first wiring line and the second wiring line are not limited to pattern wiring lines and may instead be wires or the like. In the case where the first wiring line and the second wiring line are wires, the resistance components and the parasitic capacitances are smaller and the degradation of the filter characteristics of the filter 10 can be suppressed.

Thus, in the case where the filter 10 is formed of a plurality of chips, wiring lines for connecting the plurality of chips to each other can be utilized as inductors.

Furthermore, at least either of the inductor L1 and the inductor L2 may be formed of a chip inductor and mounted on the wiring substrate.

[2. Resonator Structure]

Hereafter, the structure of the resonators forming the filter 10 will be described in more detail by focusing on an arbitrary resonator. The other resonators have substantially the same structure as the arbitrary resonator, and therefore detailed description thereof is omitted.

Each of FIGS. 3A and 3B is an example of a diagram that schematically illustrates the structure of a resonator in this embodiment, where FIG. 3A is a plan view and FIG. 3B is a sectional view. The resonator illustrated in FIGS. 3A and 3B is for explaining the typical structure of the resonators constituting the filter 10. Therefore, the number, the length, and so forth of the electrode fingers constituting the IDT electrode of each resonator of the filter 10 are not limited to the number, the length, and so forth of the electrode fingers of the IDT electrode illustrated in the figure. In the figure, illustration of the reflectors of the resonator is omitted.

As illustrated in FIGS. 3A and 3B, the resonator includes an IDT electrode 101, a piezoelectric substrate 102 on which the IDT electrode 101 is formed, and a protective layer 103 that covers the IDT electrode 101. Hereafter, these constituent elements will be described in detail.

As illustrated in FIG. 3A, a pair of interdigital electrodes 101a and 101b, which constitute the IDT electrode 101 and face to each other, are formed on the piezoelectric substrate 102. The interdigital electrode 101a is formed of a plurality of electrode fingers 110a, which are parallel to each other, and a busbar electrode 111a that connects the plurality of electrode fingers 110a to each other. Furthermore, the interdigital electrode 101b is formed of a plurality of electrode fingers 110b, which are parallel to each other, and a busbar electrode 111b that connects the plurality of electrode fingers 110b to each other. The plurality of electrode fingers 110a and 110b are formed so as to extend in a direction that is perpendicular to a propagation direction.

The interdigital electrodes 101a and 101b may also be individually referred to as IDT electrodes. However, hereafter, for convenience, description will be given while assuming that the one IDT electrode 101 is formed of the pair of interdigital electrodes 101a and 101b.

In addition, as illustrated in FIG. 3B, the IDT electrode 101, which is formed of the plurality of electrode fingers 110a and 110b and the busbar electrodes 111a and 111b, has a multilayer structure consisting of an adhesive layer 101g and a main electrode layer 101h.

The adhesive layer 101g is a layer for improving adhesion between the piezoelectric substrate 102 and the main electrode layer 101h, and Ti is used as the material thereof, for example. The film thickness of the adhesive layer 101g is 12 nm, for example.

For example, Al containing 1% Cu is used as the material of the main electrode layer 101h. The film thickness of the main electrode layer 101h is 162 nm, for example.

The piezoelectric substrate 102 is a substrate on which the IDT electrode 101 is formed, and is for example composed of a $LiTaO_3$ piezoelectric single crystal, a $LiNbO_3$ piezoelectric single crystal, a $KNbO_3$ piezoelectric single crystal, quartz, or a piezoelectric ceramic.

The protective layer 103 is formed so as to cover the interdigital electrodes 101a and 101b. The purpose of the protective layer 103 is to protect the main electrode layer 101h from the outside environment, adjust the frequency-temperature characteristic, increase moisture resistance, and so forth, and for example is a film having silicon dioxide as a main component.

The structure of each resonator of the filter 10 is not limited to the structure illustrated in FIGS. 3A and 3B. For example, the IDT electrode 101 may have a multilayer structure consisting of metal films or may be composed of a single metal film layer. In addition, the materials forming the adhesive layer 101g, the main electrode layer 101h, and the protective layer 103 are not limited to the above-described materials. Furthermore, for example, the IDT electrode 101 may be formed of a metal such as Ti, Al, Cu, Pt, Au, Ag, or Pd or an alloy of such a metal, and may be formed of a plurality of multilayer bodies composed of such metals or alloys. In addition, the protective layer 103 does not have to be formed.

In the thus-configured resonator (acoustic wave resonator), the wavelength of an excited acoustic wave is determined by the design parameters and so forth of the IDT electrode 101. In other words, the resonant frequency and the anti-resonant frequency of the resonator are determined by the design parameters and so forth of the IDT electrode 101. Hereafter, the design parameters of the IDT electrode 101, i.e., the design parameters of the interdigital electrode 101a and the interdigital electrode 101b will be described.

The wavelength of an acoustic wave is determined by a repeating period $\lambda$ of the plurality of electrode fingers 110a or 110b constituting the interdigital electrode 101a or 101b illustrated in FIGS. 3A and 3B. Furthermore, the electrode pitch (electrode period) is ½ the repeating period $\lambda$, and is defined by (W+S), where W is the line width of the electrode fingers 110a and 110b constituting the interdigital electrodes and 101a and 101b and S is the width of a space between adjacent electrode fingers 110a and 110b. In addition, as illustrated in FIG. 3A, a cross width L of the IDT electrode 101 is an electrode finger width over which the electrode fingers 110a of the interdigital electrode 101a and the electrode fingers 110b of the interdigital electrode 101b overlap when viewed in the propagation direction of an acoustic wave. In addition, an electrode duty (duty ratio) is a line width occupation ratio of the plurality of electrode fingers 110a and 110b, and is defined by the ratio of the line width of the plurality of electrode fingers 110a and 110b with respect to the sum of the line width of the plurality of electrode fingers 110a and 110b and the space width, that is, W/(W+S). Furthermore, the term "number of pairs" refers to the number of electrode fingers 110a and electrode fingers 110b of the interdigital electrodes 101a and 101b that form pairs, and is roughly half the total number of electrode fingers 110a and electrode fingers 110b. For example, M=2N+1 is satisfied, where N is the number of pairs and M is the total number of electrode fingers 110a and electrode fingers 110b. In other words, the regions interposed between the leading end part of one electrode finger of one out of the interdigital electrodes 101a and 101b and the other busbar electrode that faces to the leading end part corresponds to 0.5 of a pair. In addition, the film thickness of the IDT electrode 101 is a thickness h of the plurality of electrode fingers 110a and 110b.

Each capacitor of the filter 10 is for example formed of interdigital electrodes having a plurality of electrode fingers in the acoustic wave propagation direction similarly to the resonators. In addition, for example, each capacitor may be formed of three-dimensional wiring lines in which two stacked wiring lines function as facing electrodes and an insulating layer or dielectric layer is provided between the facing electrodes.

[3. Filter Characteristics]

Next, filter characteristics of the filter 10 according to this embodiment will be described.

FIG. 4 is a graph illustrating characteristics of the filter 10 according to embodiment 1. Specifically, the figure is a graph illustrating the filter characteristics of the filter 10 when the switches SW1 and SW2 are in a conductive state and a non-conductive state. When the switch SW1 is in a non-conductive state, the impedance characteristic of the first parallel arm resonance circuit is a characteristic in which there is an effect from the capacitor C1. In other words, in this state, the combined characteristic of the parallel arm resonator p1 and the capacitor C1 is the impedance characteristic of the first parallel arm resonance circuit. In addition, when the switch SW2 is in a non-conductive state, the impedance characteristic of the second parallel arm resonance circuit is a characteristic in which there is an effect from the capacitor C2. In other words, in this state, the combined characteristic of the parallel arm resonator p2 and the capacitor C2 is the impedance characteristic of the second parallel arm resonance circuit.

In the filter 10, fp1 and fp2 respectively represent the resonant frequencies of the parallel arm resonators p1 and p2. An attenuation pole corresponding to the resonant frequency of the first parallel arm resonance circuit when the switches SW1 and SW2 are in a non-conductive state (referred to as first resonant frequency) is either one out of an attenuation pole indicated in part A in FIG. 4 (referred to as attenuation pole A) and an attenuation pole indicated in part B in FIG. 4 (referred to as attenuation pole B) and an attenuation pole corresponding to the resonant frequency of the second parallel arm resonance circuit (referred to as second resonant frequency) is the other attenuation pole. Therefore, an attenuation band on the low-frequency side of the pass band is formed by the attenuation poles A and B.

Here, when the switches SW1 and SW2 are switched to a conductive state, the impedance characteristic of the first parallel arm resonance circuit is a combined characteristic resulting from the parallel circuit consisting of the capacitor C1 and the inductor L1 being connected in series with the parallel arm resonator p1. Since the impedance of the inductor L1 is substantially lower than that of the capacitor C1, the characteristic of the series circuit consisting of the parallel arm resonator p1 and the inductor L1 is dominant in the characteristic of the first parallel arm resonance circuit. In other words, in this state, the impedance characteristic of the first parallel arm resonance circuit is substantially the combined characteristic of the parallel arm resonator p1 and the inductor L1, and one attenuation pole out of the attenuation pole A and the attenuation pole B is shifted toward the low-frequency side. For example, in the case where the one attenuation pole is the attenuation pole B, the attenuation pole B is shifted to the attenuation pole indicated in part D in FIG. 4. In addition, when the switches SW1 and SW2 are switched to a conductive state, the impedance characteristic of the second parallel arm resonance circuit is a combined characteristic resulting from the parallel circuit consisting of the capacitor C2 and the inductor L2 being connected in series with the parallel arm resonator p2. Since the impedance of the inductor L2 is substantially lower than that of the capacitor C2, the characteristic of the series circuit consisting of the parallel arm resonator p2 and the inductor L2 is dominant in the characteristic of the second parallel arm resonance circuit. In other words, in this state, the impedance characteristic of the second parallel arm resonance circuit is substantially the combined characteristic of the parallel arm resonator p2 and the inductor L2, and the other attenuation pole is shifted toward the low-frequency side. For example, in the case where the other attenuation pole is the attenuation pole A, the attenuation pole A is shifted to the attenuation pole indicated in part C in FIG. 4.

When the switches SW1 and SW2 are in a non-conductive state, as the bandpass characteristic of the filter 10, a second bandpass characteristic is obtained in which the first resonant frequency is the resonant frequency of the combined characteristic of the parallel arm resonator p1 and the capacitor C1, and the second resonant frequency is the resonant frequency in the combined characteristic of the parallel arm resonator p2 and the capacitor C2. When the switches SW1 and SW2 are in a conductive state, as the bandpass characteristic of the filter 10, a first bandpass characteristic is obtained in which the first resonant frequency is substantially the resonant frequency of the combined characteristic of the parallel arm resonator p1 and the inductor L1, and the second resonant frequency is substantially the resonant frequency of the combined characteristic of the parallel arm resonator p2 and the inductor L2. Therefore, when the switches SW1 and SW2 are in a conductive state, a first bandpass characteristic, in which the first resonant frequency and the second resonant frequency are spaced further apart and the band width of the attenuation band is large or a first bandpass characteristic in which the first resonant frequency and the second resonant frequency are closer together and the attenuation amount of the attenuation band is large, can be formed by adjusting the first inductance value of the inductor L1 and the second inductance value of the inductor L2.

FIG. 5 is a graph illustrating an example of changes in the band width (difference between first resonant frequency and second resonant frequency) of an attenuation band at 685-687 MHz that occur when the first inductance value of the inductor L1 is changed. As illustrated in FIG. 5, it is clear that as the change in the first inductance value (that is, the difference between the first inductance value and the second inductance value) becomes larger, the band width of the attenuation band increases.

FIG. 6 is a graph illustrating the filter characteristics of the filter 10 when the first inductance value of the inductor L1 is changed. FIG. 6 illustrates the filter characteristics when the switches SW1 and SW2 are in a conductive state. The filter characteristic when the switches SW1 and SW2 are in a non-conductive state is the same as the filter characteristic represented by the solid line in FIG. 4, and is therefore omitted. In FIG. 6, the bandpass characteristic when the first inductance value is 2.5 nH is represented by a solid line, and the bandpass characteristic when the first inductance value is 5 nH is represented by a broken line.

As illustrated by the solid line in FIG. 6, it is clear that the band width (difference between first resonant frequency and second resonant frequency) of the attenuation band on the low-frequency side of the pass band when the first inductance value is 2.5 nH is small, but a large attenuation amount is obtained. On the other hand, as illustrated by the broken line in FIG. 6, it is clear that the band width (difference between first resonant frequency and second resonant frequency) of the attenuation band on the low-frequency side of the pass band when the first inductance value is 5 nH is large, and that attenuation can be secured across a wide band.

[4. Effects Etc.]

As described above, in the filter 10 (acoustic wave filter device) according to embodiment 1, the attenuation amount of the attenuation band increases as the resonant frequency of the first parallel arm resonance circuit (first resonant frequency) and the resonant frequency of the second parallel arm resonance circuit (second resonant frequency) become closer together, and the band width of the attenuation band increases as the first resonant frequency and the second resonant frequency become more spaced apart.

Here, in the case where the switches SW1 and SW2 are switched from a non-conductive state to a conductive state, the first resonant frequency is shifted toward the low-frequency side in accordance with the inductance value (first inductance value) of the inductor L1 (first inductor) and the second resonant frequency is shifted toward the low-frequency side in accordance with the inductance value (second inductance value) of the inductor L2 (second inductor). In other words, the first resonant frequency and the second resonant frequency when the switches SW1 and SW2 are in a conductive state can be set to the desired frequencies by setting the first inductance value and the second inductance value to different values. That is, when the switches SW1 and SW2 are in a conductive state, a first bandpass characteristic, in which the first resonant frequency and the second resonant frequency are spaced further apart and the band width of the attenuation band is large or a first bandpass characteristic in which the first resonant frequency and the second resonant frequency are closer together and the attenuation amount of the attenuation band is large, can be formed by adjusting the first inductance value of the inductor L1 and the second inductance value of the inductor L2. Therefore, according to this embodiment, the attenuation band width can be increased when the frequency of the pass band and the frequency of the attenuation band are switched to lower frequencies.

Furthermore, the first inductance value is smaller than the second inductance value in the filter 10 according to embodiment 1. Power consumption from a radio-frequency signal inputted to the input/output terminal 11$m$ is larger in an element that is close to the input/output terminal 11$m$ to which a radio-frequency power is inputted that is higher than a radio-frequency power inputted to the input/output terminal 11$n$ among the elements constituting the filter 10. In other words, the power consumption of the switch SW1 in the first parallel arm resonance circuit connected to the node x1 (first node) that is close to the input/output terminal 11$m$ is large. With respect to this, in the case where the first impedance element and the second impedance element are the capacitors C1 and C2, the voltage acting on the switch SW1 is proportional to the first impedance value. Specifically, this is because the following formula 1 holds true when the parallel arm resonator undergoes resonance. In Formula 1, Vsw is the voltage acting on the switch, Io is the current flowing to the parallel arm, La is the inductance value of the parallel arm resonance circuit, and Ca is the capacitance value.

[Math 1]

$$V_{SW} = I_o \times \sqrt{\frac{La}{Ca}} \quad (1)$$

Therefore, as a result of making the first inductance value smaller than the second inductance value, the voltage acting on the switch SW1 is low, the power consumption of the switch SW1 can be made smaller, and therefore an electric power handling characteristic can be improved.

In the case where the first impedance element and the second impedance element are inductors, it is preferable that the inductance value of the inductor L1 be smaller than the inductance value of the inductor L2 when a circuit in which the inductor L1 and the switch SW1 are connected in series with each other is connected in parallel with an inductor that is the first impedance element. In this case as well, it is because the voltage acting on the switch SW1 is proportional to the first inductance value.

On the other hand, in the case where the first impedance element and the second impedance element are inductors, it is preferable that the inductance value of the inductor L1 be larger than the inductance value of the inductor L2 when the inductor L1 is connected between the parallel arm resonator p1 and a circuit in which an inductor, which is the first impedance element, and the switch SW1 are connected in parallel with each other. In this case, the voltage acting on the switch SW1 is inversely proportional to the first inductance value. Specifically, this is because the following formulas 2 to 4 hold true when the parallel arm resonator undergoes resonance. In Formula 2, Vsw is the voltage acting on the switch, Io is the current flowing to the parallel arm, and Zsw is the impedance of the switch part. In Formula 3, ω is the angular frequency, L is the inductance value of the impedance element, and C is the off capacitance of the switch. In Formula 4, La is the inductance value and Ca is the capacitance value of the parallel arm resonance circuit.

[Math 2]

$$V_{SW} = I_o \times Z_{SW} \quad (2)$$

[Math 3]

$$Z_{SW} = \frac{\omega L}{1 - \omega^2 LC} \quad (3)$$

[Math 4]

$$\omega = \frac{1}{\sqrt{La \times Ca}} \quad (4)$$

Therefore, in this case, as a result of making the first inductance value larger than the second inductance value, the voltage acting on the switch SW1 is low, the power consumption of the switch SW1 can be made smaller, and therefore an electric power handling characteristic can be improved.

Furthermore, in the filter 10 according to embodiment 1, the inductor L1 is the first wiring line on a path that connects the parallel arm resonator p1 and ground to each other via the switch SW1 and the inductor L2 is the second wiring line on a path that connects the parallel arm resonator p2 and ground to each other via the switch SW2. For example, in the case where the parallel arm resonators p1 and p2 and the switches SW1 and SW2 are mounted on a substrate as different components, the first wiring line connecting the parallel arm resonator p1 and the switch SW1 to each other and the second wiring line connecting the parallel arm resonator p2 and the switch SW2 to each other are provided on or in the substrate. In other words, the first wiring line and the second wiring line connected between the components can be used as the inductors L1 and L2, and therefore the inductors L1 and L2 can be easily implemented.

Furthermore, in the filter 10 according to embodiment 1, the first inductance value and the second inductance value can be easily made different from each other by appropriately designing the lengths, widths, or shapes of the first wiring line and the second wiring line.

Modification of Embodiment 1

In the above-described embodiment, the first inductance value of the inductor L1 and the second inductance value of the inductor L2 are different from each other due to the length of the first wiring line and the length of the second wiring line being different from each other. However, the first inductance value and the second inductance value may be made different from each other by making the width (line width) of the first wiring line and the width (line width) of the second wiring line different from each other.

In addition, the first inductance value of the inductor L1 in the first parallel arm resonance circuit connected to the node x1 that is close to the input/output terminal 11m, which is the input terminal, is preferably smaller than the second inductance value. Consequently, the first inductance value can be made smaller than the second inductance value by making the line width of the first wiring line, which is the inductor L1, larger than the line width of the second wiring line, which is the inductor L2.

Thus, the first inductance value and the second inductance value can be easily made different from each other by setting the line width of the first wiring line and the line width of the second wiring line to different widths.

Furthermore, in the above-described embodiment, the first wiring line is a wiring line that is connected between the switch SW1 and a connection node between the parallel arm resonator p1 and the capacitor C1, and the second wiring line is a wiring line that is connected between the switch SW2 and the connection node between the parallel arm resonator p2 and the capacitor C2. However, the first wiring line may instead be a wiring line that is connected between the parallel arm resonator p1 and a connection node between the switch SW1 and the capacitor C1, and the second wiring line may instead be a wiring line that is connected between the parallel arm resonator p2 and a connection node between the switch SW2 and the capacitor C2.

FIG. 7 is a circuit configuration diagram of a filter 10A according to a modification of embodiment 1.

In the above-described embodiment, the series arm resonator s1, the parallel arm resonators p1 and p2, and the capacitors C1 and C2 are formed in the same chip 12, and the switches SW1 and SW2 are formed in the same chip 13. However, as illustrated in FIG. 7, the series arm resonator s1 and the parallel arm resonators p1 and p2 may be formed in an identical chip 14, and the switches SW1 and SW2 and the capacitors C1 and C2 may be formed in an identical chip 15. In this case, the first wiring line, which is the inductor L1, is a wiring line that is connected between the parallel arm resonator p1 and the connection node between the switch SW1 and the capacitor C1, and the second wiring line, which is the inductor L2, is a wiring line that is connected between the parallel arm resonator p2 and the connection node between the switch SW2 and the capacitor C2.

In this case, when the switches SW1 and SW2 are in a non-conductive state, a second bandpass characteristic is obtained in which the first resonant frequency is the resonant frequency of the combined characteristic of a series circuit consisting of the parallel arm resonator p1, the capacitor C1 and the inductor L1, and the second resonant frequency is the resonant frequency of the combined characteristic of a series circuit consisting of the parallel arm resonator p2, the capacitor C2, and the inductor L2. On the other hand, when the switches SW1 and SW2 are in a conductive state, a first bandpass characteristic is obtained in which the first resonant frequency is substantially the resonant frequency of the combined characteristic of the parallel arm resonator p1 and the inductor L1, and the second resonant frequency is substantially the resonant frequency of the combined characteristic of the parallel arm resonator p2 and the inductor L2.

In this case as well, the first inductance value and the second inductance value are made different from each other by appropriately adjusting the length, width, or shape of the first wiring line and the second wiring line.

Embodiment 2

The filters (acoustic wave filter devices) according to the above-described embodiment and modification are tunable filters in which the pass band can be changed. As filters according to embodiment 2, application examples of such a tunable filter will be described using application examples 1 to 4.

Application Example 1

FIG. 8 is a circuit configuration diagram of a filter 20A according to application example 1 of embodiment 2.

Compared with the filter 10 illustrated in FIG. 1, the filter 20A illustrated in the figure further includes a third parallel arm resonance circuit connected in parallel with the first parallel arm resonance circuit between the node x1 and ground and a fourth parallel arm resonance circuit connected in parallel with the second parallel arm resonance circuit between the node x2 and ground. The third parallel arm resonance circuit includes a parallel arm resonator p3 (third parallel arm resonator) that is connected to the node x1, and the fourth parallel arm resonance circuit includes a fourth parallel arm resonator that is connected to the node x2. In addition, the resonant frequency of the parallel arm resonator p1 (referred to as fp1) is different from the resonant frequency of the parallel arm resonator p3 (referred to as fp3), and the resonant frequency of the parallel arm resonator p2 (referred to as fp2) is different from the resonant frequency of the parallel arm resonator p4 (referred to as fp4). In this application example, fp1 is higher than fp3 and fp2 is higher than fp4.

Here, a filter 200A formed of the series arm resonator s1, the second parallel arm resonance circuit, and the fourth parallel arm resonance circuit of the filter 20A will be described.

FIG. 9A is a circuit configuration diagram of a filter 200A formed of the series arm resonator s1, the second parallel arm resonance circuit, and the fourth parallel arm resonance circuit of application example 1 of embodiment 2. Illustration of the inductor L2 is omitted from FIG. 9A.

In the filter 200A illustrated in the figure, the frequency at which the impedance is minimum and the frequency at which the impedance is maximum are both shifted toward the low-frequency side or the high-frequency side in accordance with whether the switch SW2 is in a conductive state or a non-conductive state.

Each of FIGS. 9B, 9C and 9D is a graph illustrating characteristics of the filter 200A of application example 1 of embodiment 2. Specifically, FIG. 9B is a graph illustrating the impedance characteristics of the resonators as standalone units (parallel arm resonators p2 and p4 and the series arm resonator s1). FIG. 9C is a graph illustrating in a comparative manner a combined impedance characteristic (combined characteristic) of the parallel arm resonance circuits (circuits formed of parallel arm resonators p2 and p4 and capacitor C2 and switch SW2 in this application example) when the switch SW2 is in a conductive state and a non-conductive state. The impedance characteristic of the series arm resonator s1 is also illustrated FIG. 9C. FIG. 9D is a graph illustrating in a comparative manner filter characteristics for when the switch SW2 is in a conductive state and a non-conductive state.

When the switch SW2 is in a conductive state, the filter 200A has a first bandpass characteristic in which the pass band is defined by the low-frequency-side anti-resonant frequency among the two anti-resonant frequencies of the parallel arm circuits and the resonant frequency of the series arm resonator s1, a pole (attenuation pole) on the low-frequency side of the pass band is defined by the resonant frequency of the parallel arm resonator p2, and a pole (attenuation pole) on the high-frequency side of the pass band is defined by the resonant frequency of the parallel arm resonator p4 and the anti-resonant frequency of the series arm resonator s1.

On the other hand, when the switch SW2 is in a non-conductive state, the impedance characteristic of the parallel arm circuits is a characteristic in which there is an effect from the capacitor C2. That is, in this state, the combined characteristic of the 2 parallel arm resonators (parallel arm resonators p2 and p4) and the capacitor C2 is the impedance characteristic of the parallel arm circuits.

In this application example, the capacitor C2 is added to just the parallel arm resonator p2 when the switch SW2 is in a non-conductive state. Therefore, as indicated by the black arrows in FIG. 9C, when the switch SW2 is switched from the conductive state to the non-conductive state, in the impedance characteristic of the parallel arm circuits (combined characteristic of parallel arms in figure), the high-frequency side resonant frequency among the two resonant frequencies and the low-frequency side anti-resonant frequency among the two anti-resonant frequencies are both shifted toward the high-frequency side.

Here, the low-frequency side anti-resonant frequency and the high-frequency side resonant frequency of the parallel arm circuits determine the attenuation slope on the high-frequency side of the pass band of the filter 200A. Therefore, as illustrated in FIG. 9D, the bandpass characteristic of the filter 200A is switched from the first bandpass characteristic to a second bandpass characteristic that is shifted toward the high-frequency side while maintaining the steepness of the attenuation slope on the high-frequency side of the pass band by switching the switch SW2 from the conductive state to the non-conductive state. In other words, as well as being able to switch the frequency of the attenuation pole on the high-frequency side of the pass band in accordance with switching of the switch SW2 between a conductive state and a non-conductive state, the filter 200A can suppress an increase in insertion loss at the high-frequency end of the pass band.

Similarly to the filter 200A, a filter formed of the series arm resonator s1, the first parallel arm resonance circuit, and the third parallel arm resonance circuit of the filter 20A can also switch the frequency of the attenuation pole on the high-frequency side of the pass band in accordance with switching of the switches SW1 and SW2 between a conductive state and a non-conductive state and can suppress an increase in insertion loss at the high-frequency end of the pass band.

Also, in the case of such a filter 20A having a multiple-stage configuration including the filter 200A (here two-stage configuration), the band width of the attenuation band can be increased and the attenuation amount can be increased when the pass band is switched, similarly to as in embodiment 1, by making the first inductance value and the second inductance value different from each other.

Application Example 2

FIG. 10 is a circuit configuration diagram of a filter 20B according to application example 2 of embodiment 2.

The filter 20B illustrated in the figure differs from the filter 20A illustrated in FIG. 8 in that fp1 is lower than fp3 and fp2 is lower than fp4.

Here, a filter 200B formed of the series arm resonator s1, the second parallel arm circuit, and the fourth parallel arm circuit of the filter 20B will be described.

FIG. 11A is a circuit configuration diagram of the filter 200B according to application example 2 of embodiment 2. Illustration of the inductor L2 is omitted from FIG. 11A.

The circuit configuration of the filter 200B is the same as that of the filter 200A, and therefore description thereof is omitted (however, fp2 is lower than fp4).

Each of FIGS. 11B, 11C and 11D is a graph illustrating characteristics of the filter 200B of application example 2 of embodiment 2. Specifically, FIGS. 11B and 11C are graphs respectively illustrating the impedance characteristics of the resonators as standalone units and the combined impedance characteristic of the parallel arm circuits, similarly to FIGS. 9B and 9C. FIG. 11D is a graph illustrating in a comparative manner filter characteristics for when the switch SW2 is in a conductive state and a non-conductive state.

In this application example, the capacitor C2 is added to just the parallel arm resonator p2 when the switch SW2 is in a non-conductive state. Therefore, as indicated by the black arrows in FIG. 11C, when the switch SW2 is switched from the conductive state to the non-conductive state, in the impedance characteristic of the parallel arm circuits (combined characteristic of parallel arms in figure), the low-frequency side resonant frequency among the two resonant frequencies and the low-frequency side anti-resonant frequency among the two anti-resonant frequencies are both shifted toward the high-frequency side.

Here, the low-frequency side anti-resonant frequency and the low-frequency side resonant frequency of the parallel arm circuits determine the attenuation slope on the low-frequency side of the pass band of the filter 200B. Therefore, as illustrated FIG. 11D, the bandpass characteristic of the filter 200B is switched from the first bandpass characteristic to a second bandpass characteristic that is shifted toward the high-frequency side while maintaining the steepness of the attenuation slope on the low-frequency side of the pass band by switching the switch SW2 from the conductive state to the non-conductive state. In other words, as well as being able to switch the frequency of the attenuation pole on the low-frequency side of the pass band in accordance with switching of the switch SW2 between a conductive state and a non-conductive state, the filter 200B can suppress an increase in insertion loss at the low-frequency end of the pass band.

Similarly to the filter 200B, a filter formed of the series arm resonator s1, the first parallel arm resonance circuit, and the third parallel arm resonance circuit of the filter 20B can also switch the frequency of the attenuation pole on the low-frequency side of the pass band in accordance with switching of the switches SW1 and SW2 between a conductive state and a non-conductive state and can suppress an increase in insertion loss at the low-frequency end of the pass band.

Also, in the case of such a filter 20B having a multiple-stage configuration including the filter 200B (here two-stage configuration), the band width of the attenuation band can be increased and the attenuation amount can be increased when the pass band is switched, similarly to as in embodiment 1, by making the first inductance value and the second inductance value different from each other.

Application Example 3

FIG. 12 is a circuit configuration diagram of a filter 20C according to application example 3 of embodiment 2.

In the filter 20C, the third parallel arm resonance circuit further includes a pair of elements consisting of a capacitor C3 (third impedance element) and a switch SW3 (third switch), which are connected in parallel with each other, that is connected in series with the parallel arm resonator p3 between the parallel arm resonator p3 and ground, and further includes an inductor L3 (third inductor) that is provided on a path that connects the parallel arm resonator p3 and ground via the switch SW3. In addition, in the filter 20C, the fourth parallel arm resonance circuit further includes a pair of elements consisting of a capacitor C4 (fourth impedance element) and a switch SW4 (fourth switch), which are connected in parallel with each other, that is connected in series with the parallel arm resonator p4 between the parallel arm resonator p4 and ground, and further includes an inductor L4 (fourth inductor) that is provided on a path that connects the parallel arm resonator p4 and ground via the switch SW4. The inductor L3 is for example a wiring line (third wiring line) on a path that connects the parallel arm resonator p3 and ground to each other via the switch SW3. The inductor L4 is for example a wiring line (fourth wiring line) on a path that connects the parallel arm resonator p4 and ground to each other via the switch SW4. In addition, the inductance value of the inductor L3 (referred to as third inductance value) and the inductance value of the inductor L4 (referred to as fourth inductance value) are different from each other. In addition, fp1 is different from fp3 and fp2 is different from fp4. In this application example, fp1 is higher than fp3 and fp2 is higher than fp4, for example.

Here, a filter 200C formed of the series arm resonator s1, the second parallel arm resonance circuit, and the fourth parallel arm resonance circuit of the filter 20C will be described.

FIG. 13A is a circuit configuration diagram of the filter 200C according to application example 3 of embodiment 2. Illustration of the inductors L2 and L4 is omitted from FIG. 13A. The filter 200C illustrated in the figure shifts the attenuation slopes on both the high-frequency side of the pass band and the low-frequency side of the pass band.

Each of FIGS. 13B, 13C and 13D is a graph illustrating characteristics of the filter 200C of application example 3 of embodiment 2. Specifically, FIGS. 13B and 13C are graphs illustrating the impedance characteristics of the resonators as standalone units and the combined impedance characteristic of the parallel arm circuits (circuits formed of parallel arm resonators p2 and p4, capacitors C2 and C4, and switches SW2 and SW4 in this application example), similarly to FIGS. 9B and 9C. FIG. 13D is a graph illustrating in a comparative manner filter characteristics for when the switches SW2 and SW4 are both in a conductive state and a non-conductive state.

In this application example, the capacitor C2 is added to the parallel arm resonator p2 and the capacitor C4 is added to the parallel arm resonator p4 when both the switches SW2 and SW4 are in a non-conductive state. Therefore, as indicated by the black arrows in FIG. 13C, when the switches SW2 and SW4 are both switched from the conductive state to the non-conductive state, in the impedance characteristic of the parallel arm circuits (combined characteristic of parallel arms in figure), both of the two resonant frequencies and the low-frequency side anti-resonant frequency among the two anti-resonant frequencies are all shifted toward the high-frequency side.

Therefore, as illustrated in FIG. 13D, the bandpass characteristic of the filter 200C is switched from the first bandpass characteristic to a second bandpass characteristic that is shifted toward the high-frequency side while maintaining the steepness of the attenuation slopes on the high-frequency side of the pass band and the low-frequency side of the pass band by switching both the switches SW2 and SW4 from the conductive state to the non-conductive state. In other words, as well as being able to switch the frequencies of the attenuation poles on the high-frequency side of the pass band and the low-frequency side of the pass band in accordance with switching of the switches SW2 and SW4 between a conductive state and a non-conductive state, the filter 200C can suppress an increase in insertion loss at the high-frequency end of the pass band and the low-frequency end of the pass band. Therefore, for example, the filter 200C can shift the center frequency while maintaining the band width.

In addition, in the filter 200C, the switches SW2 and SW4 do not have to be switched to a conductive state or a non-conductive state together, and may instead be individually switched to a conductive state or a non-conductive state. However, in the case where the switches SW2 and SW4 are switched to a conductive state or a non-conductive state together, the number of control lines for controlling the switches SW2 and SW4 can be reduced, and therefore the configuration of the filter 200C is simplified.

On the other hand, when the switches are individually switched to a conductive state or a non-conductive state, the number of pass band variations that can be switched between using the filter 200C can be increased.

Specifically, since fp2 is higher than fp4, the high-frequency end of the pass band can be changed in accordance with switching of the switch SW2, which is serially connected to the parallel arm resonator p2, between a conductive state and a non-conductive state, and the low-frequency end of the pass band can be changed in accordance with switching of the switch SW4, which is serially connected to the parallel arm resonator p4, between a conductive state and a non-conductive state.

Therefore, the low-frequency end and the high-frequency end of the pass band can be both shifted toward the low-frequency side or the high-frequency side by switching the switches SW2 and SW4 to a conductive state or a non-conductive state together. In other words, the center frequency of the pass band can be shifted toward the low-frequency side or the high-frequency side. In addition, both the low-frequency end and the high-frequency end of the pass band can be shifted such that the frequency difference therebetween is increased or decreased by switching either one out of the switches SW2 and SW4 from a conductive state to a non-conductive state and switching the other one out of the switches SW2 and SW4 from a non-conductive state to a conductive state. In other words, the pass band width can be changed while maintaining the center frequency of the pass band substantially constant. In addition, either one out of the low-frequency end and the high-frequency end of the pass band can remain fixed while the other end can be shifted toward the low-frequency side or the high-frequency side by leaving one out of the switches SW2 and SW4 in a conductive state or a non-conductive state while switching the other one out of the switches SW2 and SW4 to a conductive state or a non-conductive state. That is, the low-frequency end or the high-frequency end of the pass band can be made variable.

Thus, the degree of freedom with which the pass band can be changed can be increased as a result of the second parallel arm resonance circuit and the fourth parallel arm resonance circuit having the capacitors C2 and C4 and the switches SW2 and SW4.

Similarly to the filter 200C, a filter formed of the series arm resonator s1, the first parallel arm resonance circuit, and the third parallel arm resonance circuit of the filter 20C can also switch the frequencies of the attenuation poles on high-frequency side of the pass band and the low-frequency side of the pass band in accordance with switching of the switches SW1 to SW4 between a conductive state and a non-conductive state and can suppress an increase in insertion loss at the high-frequency end and the low-frequency end of the pass band. In addition, the degree of freedom with which the pass band can be changed can be increased as a result of the first parallel arm resonance circuit and the third parallel arm resonance circuit having the capacitors C1 and C3 and the switches SW1 and SW3.

Also, in the case of such a filter 20C having a multiple stage configuration including the filter 200C (here two-stage configuration), the band width of the attenuation band can be increased and the attenuation amount can be increased at both the high-frequency side of the pass band and the low-frequency side of the pass band when the pass band is switched by making the first inductance value and the second inductance value different from each other and making the third inductance value and the fourth inductance value different from each other.

Application Example 4

FIG. 14 is a circuit configuration diagram of a filter 20D according to application example 4 of embodiment 2.

The filter 20D illustrated in the figure differs from the filter 20A illustrated in FIG. 8 in that a pair of elements consisting of the capacitor C1 and the switch SW1, which are connected in parallel with each other, is serially connected to a circuit consisting of the parallel arm resonator p1 and the parallel arm resonator p3 connected in parallel with each other, and a pair of elements consisting of the capacitor C2 and the switch SW2, which are connected in parallel with each other, is serially connected to a circuit consisting of the parallel arm resonator p2 and the parallel arm resonator p4 connected in parallel with each other. Here, a first parallel arm resonance circuit is formed by the circuit in which the pair of elements consisting of the capacitor C1 and the switch SW1, which are connected in parallel with each other, is serially connected to the circuit consisting of the parallel arm resonator p1 and the parallel arm resonator p3, which are connected in parallel with each other, and a second parallel arm resonance circuit is formed by the circuit in which the pair of elements consisting of the capacitor C2 and the switch SW2, which are connected in parallel with each other, is serially connected to the circuit consisting of the parallel arm resonator p2 and the parallel arm resonator p4, which are connected in parallel with each other.

Here, a filter 200D formed of the series arm resonator s1 and the second parallel arm resonance circuit of the filter 20D will be described.

FIG. 15A is a circuit configuration diagram of the filter 200D according to application example 4 of embodiment 2.

Each of FIGS. 15B, 15C and 15D is a graph illustrating characteristics of the filter 200D of application example 4 of embodiment 2. Specifically, FIGS. 15B and 15C are graphs respectively illustrating the impedance characteristics of the resonators as standalone units and the combined impedance characteristic of the parallel arm circuits, similarly to FIGS. 9B and 9C. FIG. 15D is a graph illustrating in a comparative manner filter characteristics for when the switch SW2 is in a conductive state and a non-conductive state.

In this application example, the capacitor C2 is added to the parallel arm resonators p1 and p2 when the switch SW2 is in a non-conductive state. Therefore, as indicated by the black arrows in FIG. 15C, when the switch SW2 is switched from a conductive state to a non-conductive state, neither of the two anti-resonant frequencies is shifted whereas the two resonant frequencies are both shifted toward the high-frequency side in the impedance characteristic of the parallel arm circuits (combined characteristic of parallel arms in figure).

Therefore, as illustrated in FIG. 15D, the bandpass characteristic of the filter 200D is switched from the first bandpass characteristic to a second bandpass characteristic in which the attenuation poles on both sides of the pass band are both shifted toward the high-frequency side by switching the switch SW2 from a conductive state to a non-conductive state.

Similarly to the filter 200D, also in a filter formed of the series arm resonator s1 and the first parallel arm resonance circuit of the filter 20D, the first bandpass characteristic is switched to a second bandpass characteristic in which the attenuation poles on both sides of the pass band are shifted toward the high-frequency side.

Also, in the case of such a filter 20D having a multiple-stage configuration including the filter 200D (here two-stage configuration), the band width of the attenuation band can be increased and the attenuation amount can be increased when the pass band is switched, similarly to as in embodiment 1, by making the first inductance value and the second inductance value different from each other.

Embodiment 3

In the above-described embodiments and modifications, it is assumed that a filter (acoustic wave filter device) includes one first series arm resonance circuit (series arm resonator s1), a first parallel arm resonance circuit connected between the node x1, which is on the input/output terminal 11m side of the first series arm resonance circuit, and ground, and a second parallel arm resonance circuit connected between the node x2, which is on the input/output terminal 11n side of the first series arm resonance circuit, and ground. However, a filter (acoustic wave filter device) may instead be formed of two or more series arm resonance circuits and three or more parallel arm resonance circuits that are respectively connected to different nodes in the series arm resonance circuits. In embodiment 3, for example, a filter 30 will be described that includes a series arm resonator s1 and a series arm resonator s2, as the two or more series arm resonance circuits, and a first parallel arm resonance circuit, a second parallel arm resonance circuit, and a fifth parallel arm resonance circuit (here one fifth parallel arm resonance circuit), as the three or more parallel arm resonance circuits.

Furthermore, a duplexer may be formed in which one terminal of the filter 30 and one terminal of a filter having a different pass band from the pass band of the filter 30 are connected to each other via a phase shifter 60 thus forming a common terminal. Here, a duplexer 50 in which one terminal of the filter 30 and one terminal of a filter 40 having a different pass band from the filter 30 are connected to each other via the phase shifter 60 thus forming a common terminal will be described using FIG. 16.

FIG. 16 is a circuit configuration diagram of the duplexer 50 according to embodiment 3.

The duplexer 50 illustrated in the figure includes: the filter 30 that, compared with the filter 10 illustrated in FIG. 1, additionally includes the series arm resonator s2, a parallel arm resonator p5, a capacitor C5, an inductor L5, and a switch SW5; the filter 40 in which the frequency of the pass band is different from that of the filter 30; and the phase shifter 60.

In the configuration of the duplexer 50, for example, the filter 30 is a transmission filter and the filter 40 is a reception filter. The input/output terminal 11m is a so-called transmission terminal to which a radio-frequency transmission signal is inputted. The input/output terminal 11n is a common terminal used by both the transmission filter and the reception filter, and is a so-called antenna common terminal from which a radio-frequency transmission signal is outputted and to which a radio-frequency reception signal is inputted. Furthermore, an input/output terminal 11l, which is the other terminal of the filter 40, is an output terminal from which a radio-frequency reception signal is outputted.

Here, the duplexer 50 is a duplexer in which one terminal of the transmission filter, which is the filter 30, and one terminal of the reception filter, which is the filter 40, are connected to each other via the phase shifter 60, but these terminals may instead be connected to each other via a switch or a circulator or may instead be directly connected to each other. In the case where these terminals are connected to each other via a switch, the pass bands of the filter 30 and the filter 40 may be overlapped.

Here, the constituent elements that the filter 30 additionally includes compared with the filter 10 illustrated in FIG. 1 will be described. The series arm resonator s2 is a second series arm resonance circuit that is provided on a path that connects the series arm resonator s1 and the input/output terminal 11n. That is, the series arm resonator s2 is a resonator that is provided in a series arm that connects the input/output terminal 11m and the input/output terminal 11n. The series arm resonator s2 is provided closest to the input/output terminal 11n among the two or more series arm resonance circuits (here, series arm resonators s1 and s2). Not limited to the series arm resonator s2, a series arm resonance circuit composed of one or more acoustic wave resonators may be provided in this series arm.

In this embodiment, the series arm resonator s1 is provided closest to the input/output terminal 11m among the series arm resonators s1 and s2. Furthermore, the node x1 is located on the input/output terminal 11m side of the series arm resonator s1 and the node x2 is located on the input/output terminal 11n side of the series arm resonator s2. That is, the node x1 is the node that is closest to the input/output terminal 11m and the node x2 is the node that is closest to the input/output terminal 11n among the nodes on the path connecting the input/output terminal 11m and input/output terminal 11n.

The parallel arm resonator p5 is a fifth parallel arm resonator that is connected between a node between the node x1 and the node x2 (node x3 in FIG. 16), and ground among the nodes on the path that connects the input/output terminal 11m and the input/output terminal 11n. In other words, the parallel arm resonator p5 is a resonator that is provided in a parallel arm that connects the node x3 on the series arm and ground to each other.

In this embodiment, the capacitor C5 is a fifth impedance element that is serially connected to the parallel arm resonator p5.

The switch SW5 is a fifth switch that has one terminal that is connected to a connection node between the parallel arm resonator p5 and the capacitor C5, and another terminal that is connected to ground.

The capacitor C5 and the switch SW5 are connected in parallel with each other and thereby form a pair of elements, and this pair of elements consisting of the capacitor C5 and the switch SW5 is connected to the parallel arm resonator p5 between the parallel arm resonator p5 and ground.

The inductor L5 is for example a fifth inductor provided on a path that connects the parallel arm resonator p5 and ground to each other via the switch SW5. The inductor L5 is for example a wiring line (fifth wiring line) on a path that connects the parallel arm resonator p5 and ground to each other via the switch SW5. Specifically, the fifth wiring line is a wiring line that connects a connection node between the parallel arm resonator p5 and the capacitor C5, and the switch SW5 to each other.

The parallel arm resonator p5, the capacitor C5, the switch SW5, and the inductor L5 form the fifth parallel arm resonance circuit that is connected between the node x3, which is on the path (on the series arm) that connects the input/output terminal 11m and the input/output terminal 11n to each other, and ground. In other words, the fifth parallel arm resonance circuit is provided in one parallel arm that connects the series arm and ground to each other.

In addition, the first inductance value and the second inductance value are smaller than the inductance value (referred to as fifth inductance value) of the fifth inductor. Furthermore, the first inductance value of the inductor L1 in the first parallel arm resonance circuit connected to the node x1 that is close to the input/output terminal 11m, which is the transmission terminal, is smaller than the second inductance value. Specifically, the first inductance value is smaller than the second inductance value due to the length of the first wiring line, which is the inductor L1, being smaller than the length of the second wiring line, which is the inductor L2. Furthermore, the second inductance value of the inductor L2 in the second parallel arm resonance circuit connected to the node x2 that is close to the input/output terminal 11n, which is the output terminal, is smaller than the fifth inductance value. Specifically, the second inductance value is smaller than the fifth inductance value due to the length of the second wiring line, which is the inductor L2, being smaller than the length of the fifth wiring line, which is the inductor L5.

Since the power consumption of the switch SW1 can be reduced by making the first inductance value smaller than the second inductance value, the electric power handling characteristic from the transmission terminal can be improved. Alternatively, a switch having a smaller electric power handling capability can be used as the switch SW1, and consequently a reduction in size can be realized. Furthermore, in this embodiment, in the case where a distortion characteristic of the switch SW2 in the second parallel arm resonance circuit connected to the node x2 that is close to the input/output terminal 11n, which is the antenna common terminal, is degraded, there is a problem in that intermodulation distortion becomes worse. With respect to this, since the power consumption of the switch SW2 can be reduced by making the second inductance value smaller than the fifth inductance value, the intermodulation distortion can be reduced.

In the fifth parallel arm resonance circuit, the frequency at which the impedance is minimum and the frequency at which the impedance is maximum are both shifted toward the low-frequency side or the high-frequency side in accordance with whether the switch SW5 is in a conductive state or a non-conductive state. In other words, the fifth parallel arm resonance circuit can change the pass band of the filter 30 together with the first parallel arm resonance circuit and the second parallel arm resonance circuit.

Next, filter characteristics of the filter 30 according to this embodiment will be described.

FIG. 17 is a graph illustrating the filter characteristics of the filter 30 of embodiment 3 when the switches are in a conductive state and a non-conductive state. "When the switches are in a conductive state" refers to a time when the switches SW1, SW2, and SW5 are all in a conductive state, and "when the switches are in a non-conductive state" refers to a time when the switches SW1, SW2, and SW5 are all in a non-conductive state.

In the filter 30, the resonant frequencies of the parallel arm resonators p1, p2, and p5 are lower than the resonant frequencies of the series arm resonators s1 and s2 and the anti-resonant frequencies of the parallel arm resonators p1, p2, and p5 are lower than the anti-resonant frequencies of the series arm resonators s1 and s2.

Table 1 illustrates in detail the resonant frequencies and anti-resonant frequencies of the resonators at this time. In the table, fr represents a resonant frequency and fa represents an anti-resonant frequency.

TABLE 1

|          | s1  | S2  | p1  | p2  | p3  |
|----------|-----|-----|-----|-----|-----|
| fr [MHz] | 720 | 720 | 690 | 690 | 690 |
| fa [MHz] | 760 | 760 | 728 | 728 | 728 |

Furthermore, the capacitance values of the capacitors C1, C2, and C5 are illustrated in Table 2, and the inductance values of the inductors L1, L2, and L5 are illustrated in Table 3. These circuit constants are merely examples, and the circuit constants of the capacitors C1, C2, and C5 and the inductors L1, L2, and L5 are not limited to these values.

TABLE 2

|  | C1 | C2 | C5 |
|---|---|---|---|
| Capacitance Value [pF] | 3 | 3 | 3 |

TABLE 3

|  | L1 | L2 | L5 |
|---|---|---|---|
| Inductance Value [nH] | 1 | 3 | 5 |

As described above, when the switches SW1, SW2, and SW5 are in a non-conductive state, as the bandpass characteristic of the filter 30, a second bandpass characteristic illustrated by the solid line in FIG. 17 is obtained in which the first resonant frequency is substantially the resonant frequency of the combined characteristic of the parallel arm resonator p1 and the capacitor C1, the second resonant frequency is the resonant frequency of the combined characteristic of the parallel arm resonator p2 and the capacitor C2, and the fifth resonant frequency is the resonant frequency of the combined characteristic of the parallel arm resonator p5 and the capacitor C5.

On the other hand, as described above, when the switches SW1, SW2, and SW5 are in a conductive state, as the bandpass characteristic of the filter 30, a first bandpass characteristic illustrated by the broken line in FIG. 17 is obtained in which the first resonant frequency is the resonant frequency of the combined characteristic of the parallel arm resonator p1 and the inductor L1, the second resonant frequency is the resonant frequency of the combined characteristic of the parallel arm resonator p2 and the inductor L2, and the fifth resonant frequency is the resonant frequency of the combined characteristic of the parallel arm resonator p5 and the inductor L5.

As illustrated in the figure, when the switches SW1, SW2, and SW5 are in a conductive state, the attenuation band on the low-frequency side of the pass band can be made wider. In addition, in the case where the attenuation band is formed of two attenuation poles, the attenuation amount between the two attenuation poles of the attenuation band is undesirably reduced, but the band width can be increased while suppressing a reduction in the attenuation amount of the attenuation band by forming the attenuation band using three attenuation poles.

Furthermore, for example, the second inductance value of the inductor L2 in the second parallel arm resonance circuit connected to the node x2 that is close to the input/output terminal 11n, which is the antenna common terminal, is smaller than the first inductance value. Specifically, the second inductance value is smaller than the first inductance value due to the length of the second wiring line, which is the inductor L2, being smaller than the length of the first wiring line, which is the inductor L1. Furthermore, the first inductance value of the inductor L1 in the first parallel arm resonance circuit connected to the node x1 that is close to the input/output terminal 11m, which is the transmission terminal, is smaller than the fifth inductance value. Specifically, the first inductance value is smaller than the fifth inductance value due to the length of the first wiring line, which is the inductor L1, being smaller than the length of the fifth wiring line, which is the inductor L5.

Table 4 illustrates the inductance values of the inductors L1, L2, and L5 at this time.

TABLE 4

|  | L1 | L2 | L5 |
|---|---|---|---|
| Inductance Value [nH] | 3 | 1 | 5 |

Since the power consumption of the switch SW2 can be reduced by making the second inductance value smaller than the first inductance value, intermodulation distortion can be reduced. In addition, since the power consumption of the switch SW1 can be reduced by making the first inductance value smaller than the fifth inductance value, the electric power handling characteristic from the transmission terminal can be improved. Alternatively, a switch having a smaller electric power handling capability can be used as the switch SW1, and consequently a reduction in size can be realized.

In the case where the first impedance element, the second impedance element, and the fifth impedance element are inductors, it is preferable that the inductance value of the inductor L1 be smaller than the inductance value of the inductor L2 and that the inductance value of the inductor L2 be smaller than the inductance value of the inductor L5 in the case where a circuit in which the inductor L1 and the switch SW1 are connected in series with each other is connected in parallel with the inductor that is the first impedance element, a circuit in which the inductor L2 and the switch SW2 are connected in series with each other is connected in parallel with the inductor that is the second impedance element, and a circuit in which the inductor L5 and the switch SW5 are connected in series with each other is connected in parallel with the inductor that is the fifth impedance element. In this case as well, this is because the voltage acting on the switch SW1 is proportional to the first inductance value and the voltage acting on the switch SW2 is proportional to the second inductance value.

On the other hand, in the case where the first impedance element, the second impedance element, and the fifth impedance element are inductors, it is preferable that the inductance value of the inductor L1 be larger than the inductance value of the inductor L2 and that the inductance value of the inductor L2 be larger than the inductance value of the inductor L5 when the inductor L1 is connected between the parallel arm resonator p1 and a circuit in which an inductor, which is the first impedance element, and the switch SW1 are connected in parallel with each other, the inductor L2 is connected between the parallel arm resonator p2 and a circuit in which an inductor, which is the second impedance element, and the switch SW2 are connected in parallel with each other, and the inductor L5 is connected between the parallel arm resonator p5 and a circuit in which an inductor, which is the fifth impedance element, and the switch SW5 are connected in parallel with each other. In this case, this is due to the voltage acting on the switch SW1 being inversely proportional to the first inductance value and the voltage acting on the switch SW2 being inversely proportional to the second inductance value. Therefore, the power consumption of the switches SW1 and SW2 can be reduced as a result of the voltage acting on the switch SW1 being reduced by making the first inductance value larger than the second inductance value and the voltage acting on the switch SW2 being reduced by making the second inductance value larger than the fifth inductance value, and therefore the electric power handling characteristics can be improved.

In this embodiment, the input/output terminal 11m is connected to the transmission terminal and the input/output terminal 11n is connected to the common terminal, but the input/output terminal 11n may instead be connected to the transmission terminal and the input/output terminal 11m may instead be connected to the common terminal.

In this embodiment, the duplexer 50 is configured such that one terminal of the filter 30 and one terminal of the filter 40 are connected to each other forming a common terminal, but a multiplexer may be configured such that terminals of two or more filters are connected to each other so as to form a common terminal. The terminals of the filters constituting the multiplexer may be directly connected to each other or may be connected to each other via a phase shifter, a switch, or a circulator. In addition, in the case where the terminals of the filters are connected to each other via a switch, the pass bands of the filters may be overlapped.

Embodiment 4

The filters (acoustic wave filter devices) described in the above embodiments and modifications can be applied to a multiplexer, a radio-frequency front end circuit, and so forth. In addition, a multiplexer (duplexer, triplexer, quadplexer, or the like) to which a filter described in any of the above embodiments and modifications has been applied is included in the scope of a filter (acoustic wave filter device) of the present disclosure. In other words, both a filter as a stand-alone unit described in any of the above embodiments and modifications and a multiplexer to which such a filter is applied is regarded as a filter (acoustic wave filter device) of the present disclosure.

A radio-frequency front end circuit will be described in this embodiment.

FIG. 18 is a circuit configuration diagram of a radio-frequency front end circuit 1 according to embodiment 4 and the circuit peripherals thereof. The figure illustrates the radio-frequency front end circuit 1, an antenna element 2, and an RF signal processing circuit (RFIC) 3. The radio-frequency front end circuit 1 and the RFIC 3 form a communication device 4. The antenna element 2, the radio-frequency front end circuit 1, and the RFIC 3 are arranged in the front end unit of a cellular phone that supports multiple modes and/or multiple bands, for example.

The antenna element 2 is an antenna that transmits and receives radio-frequency signals and supports multiple bands in accordance with a communication standard such as LTE, for example. The antenna element 2 does not need to support all of the bands of the communication device 4, and may support just the bands of a low frequency band group or a high frequency band group, for example. Furthermore, the antenna element 2 may be provided separate to the communication device 4 rather than being built into the communication device 4.

The radio-frequency front end circuit 1 is a circuit that transmits a radio-frequency signal between the antenna element 2 and the RFIC 3. Specifically, the radio-frequency front end circuit 1 transmits a radio-frequency signal outputted from the RFIC 3 (here, radio-frequency transmission signal) to the antenna element 2 via a transmission signal path. In addition, the radio-frequency front end circuit 1 transmits a radio-frequency signal received via the antenna element 2 (here, radio-frequency reception signal) to the RFIC 3 via a reception signal path.

The radio-frequency front end circuit 1 includes a duplexer 120, a transmission amplification circuit 140, and a reception amplification circuit 160.

The duplexer 120 is a multiplexer that includes a transmission filter 120Tx and a reception filter 120 Rx, and includes an acoustic wave filter device as described above as at least one of these filters. Antenna-side input/output terminals of the transmission filter 120Tx and the reception filter 120 Rx are connected together and connected to the antenna element 2 and the other terminals of the filters are respectively connected to the transmission amplification circuit 140 and the reception amplification circuit 160.

The transmission amplification circuit 140 is a power amplifier that amplifies the power of a radio-frequency transmission signal outputted from the RFIC 3.

The reception amplification circuit 160 is a low-noise amplifier that amplifies the power of a radio-frequency reception signal received by the antenna element 2.

The RFIC 3 is an RF signal processing circuit that processes radio-frequency signals transmitted and received by the antenna element 2. Specifically, the RFIC 3 performs signal processing using down conversion and so forth on a radio-frequency signal inputted from the antenna element 2 via the reception signal path of the radio-frequency front end circuit 1 (in this case, radio-frequency reception signal), and outputs a reception signal generated through this signal processing to a baseband signal processing circuit (not illustrated). In addition, the RFIC 3 performs signal processing using up conversion and so forth on a transmission signal inputted from the base band signal processing circuit, and outputs a radio-frequency signal generated through this signal processing (in this case, radio-frequency transmission signal) to the transmission signal path of the radio-frequency front end circuit 1.

The radio-frequency front end circuit 1 includes an acoustic wave filter device as described above, and consequently is capable of increasing the band width and increasing the attenuation amount of an attenuation band when the pass band is switched. Therefore, this is particularly useful in the radio-frequency front end circuit 1 applied to the communication device 4 that supports multiple bands.

Modification of Embodiment 4

The filters (acoustic wave filter devices) described in the above embodiments and modifications can be applied to a radio-frequency front end circuit that supports a system having a greater number of utilized bands than the radio-frequency front end circuit 1 according to embodiment 4. Accordingly, such a radio-frequency front end circuit will be described in this modification.

FIG. 19 is a configuration diagram of a radio-frequency front end circuit 1A according to a modification of embodiment 4.

As illustrated in the figure, the radio-frequency front end circuit 1A has an antenna terminal ANT, transmission terminals Tx1 and Tx2, and reception terminals Rx1 and Rx2, and includes, in order from the antenna terminal ANT side, a switch group 110 formed of a plurality of switches, a filter group 120A formed of a plurality of filters, transmission switches 130A and 130B, reception switches 150A, 150B, and 150C, transmission amplification circuits 140A and 140B, and reception amplification circuits 160A and 160B.

The switch group 110 connects the antenna terminal ANT and signal paths corresponding to prescribed bands in accordance with a control signal from a control unit (not illustrated) and is formed of a plurality of SPST switches, for example. The configuration is not limited to only one signal path being connected to the antenna terminal ANT, and a plurality of signal paths may be connected to the antenna terminal ANT. In other words, the radio-frequency front end circuit 1A may support carrier aggregation.

The filter group 120A is formed of a plurality of filters (including duplexers) in which the following bands are included in the pass bands thereof. Specifically, the bands are (i) Band 12 transmission band, (ii) Band 13 transmission band, (iii) Band 14 transmission band, (iv) Band 27 (or Band 26) transmission band, (v) Band 29 and Band (or Band 12, Band 67, and Band 13) reception band, (vi-Tx) Band 68 and Band 28a (or Band 68 and Band 28b) transmission band, (vi-Rx) Band 68 and Band 28a (or Band 68 and Band 28b) reception band, (vii-Tx) Band 20 transmission band, (vii-Rx) Band 20 reception band, (viii) Band 27 (or Band 26) reception band, (ix-Tx) Band 8 transmission band, and (ix-Rx) Band 8 reception band.

The transmission switch 130A is a switch circuit having a plurality of selection terminals that are connected to a plurality of transmission signal paths on the low band side and having a common terminal that is connected to the transmission amplification circuit 140A. The transmission switch 130B is a switch circuit having a plurality of selection terminals that are connected to a plurality of transmission signal paths on the high band side and having a common terminal that is connected to the transmission amplification circuit 140B. The transmission switches 130A and 130B are provided in a stage prior to the filter group 120A (here, stage prior to transmission signal paths) and are switch circuits in which a connection state thereof is switched in accordance with a control signal from a control unit (not illustrated). Thus, radio-frequency signals (here, radio-frequency transmission signals) amplified by the transmission amplification circuits 140A and 140B are outputted from the antenna terminal ANT to the antenna element 2 (refer to FIG. 18) after passing through prescribed filters of the filter group 120A.

The reception switch 150A is a switch circuit having a plurality of selection terminals that are connected to a plurality of reception signal paths on the low band side and having a common terminal that is connected to the reception amplification circuit 160A. The reception switch 150B is a switch circuit having a common terminal that is connected to a reception signal path of a prescribed band (here, Band 20) and having two selection terminals that are connected to a common terminal of the reception switch 150A and a common terminal of the reception switch 150B. The reception switch 150C is a switch circuit having a plurality of selection terminals that are connected to a plurality of reception signal paths on the high band side and having a common terminal that is connected to the reception amplification circuit 160B. These reception switches 150A to 150C are provided in a stage subsequent to the filter group 120A (here, the stage subsequent to reception signal paths), and the connection states thereof are switched in accordance with a control signal from the control unit (not illustrated). Thus, radio-frequency signals inputted to the antenna terminal ANT (here, radio-frequency reception signals) pass through prescribed filters of the filter group 120A, are amplified by the reception amplification circuits 160A and 160B, and are outputted to the RFIC 3 (refer to FIG. 18) from the reception terminals Rx1 and Rx2. An RFIC that supports low bands and an RFIC that supports high bands may be individually provided.

The transmission amplification circuit 140A is a power amplifier that amplifies the power of a low-band radio-frequency transmission signal and the transmission amplification circuit 140B is a power amplifier that amplifies the power of a high-band radio-frequency transmission signal.

The reception amplification circuit 160A is a low-noise amplifier that amplifies the power of a low-band radio-frequency reception signal and the reception amplification circuit 160B is a low-noise amplifier that amplifies the power of a high-band radio-frequency reception signal.

The thus-configured radio-frequency front end circuit 1A includes the filter 20A according to application example 1 of embodiment 2 as a filter having the (iv) Band 27 (or Band 26) transmission band in the pass band thereof. That is, the pass band of the filter is switched between the Band 27 transmission band and the Band 26 transmission band in accordance with a control signal.

Furthermore, the radio-frequency front end circuit 1A includes the filter 20B according to application example 2 of embodiment 2 as a reception filter having the (vi-Rx) Band 68 and Band 28a (or Band 68 and Band 28b) reception band in the pass band thereof and includes the filter 20C according to application example 3 of embodiment 2 as a transmission filter having the (vi-Tx) Band 68 and Band 28a (or Band 68 and Band 28b) transmission band in the pass band thereof. In other words, the pass band of a duplexer formed of this transmission filter and this reception filter is switched between the Band 68 and Band 28a transmission band and the Band 68 and Band 28b transmission band and is switched between the Band 68 and Band 28a reception band and the Band 68 and Band 28b reception band in accordance with a control signal.

In addition, the radio-frequency front end circuit 1A includes the filter 20B according to application example 2 of embodiment 2 as a filter having the (viii) Band 27 (or Band 26) reception band in the pass band thereof. That is, the pass band of the filter is switched between the Band 27 reception band and the Band 26 reception band in accordance with a control signal.

The thus-configured radio-frequency front end circuit 1A includes the filters 20A to 20C (acoustic wave filter devices) according to application examples 1 to 3 of embodiment 2 described above, and consequently the number of filters can be reduced compared with the case where a filter is provided for each band, and therefore a reduction in size can be realized.

In addition, the radio-frequency front end circuit 1A according to this embodiment includes the transmission switches 130A and 130B and the reception switches 150A to 150C (switch circuits) provided in a stage prior to or subsequent to the filter group 120A (plurality of acoustic wave filter devices). Thus, common signal paths can be used for parts of the signal paths along which radio-frequency signals propagate. Therefore, for example, the transmission amplification circuits 140A and 140B or the reception amplification circuits 160A and 160B (amplification circuits) can be commonly used to support a plurality of acoustic wave filter devices. Therefore, the radio-frequency front end circuit 1A can be reduced in size and cost.

It is sufficient that at least one of the transmission switches 130A and 130B and the reception switches 150A to 150C be provided. Furthermore, the number of transmission switches 130A and 130B and the number of reception switches 150A to 150C are not limited to the numbers described above, and one transmission switch and one reception switch may be provided, for example. In addition, the numbers of selection terminals and so forth of the transmission switches and reception switches are also not limited to the numbers given in this embodiment, and may each be 2, for example.

Furthermore, the configurations of the filters according to embodiment 1 and the modification thereof may be applied to at least one filter among a plurality of filters included in a filter group.

Other Embodiments

The acoustic wave filter devices and radio-frequency front end circuits according to embodiments of the present disclosure described above have been described in the form of embodiments 1 to 4 and modifications thereof, but the present disclosure is not limited to these embodiments and modifications. Other embodiments realized by combining any of the constituent elements of the above-described embodiments and modifications with one another, modifications obtained by modifying the above-described embodiments in various ways, as thought of by one skilled in the art, without departing from the gist of the present disclosure, and various devices having an acoustic wave filter device and a radio-frequency front end circuit of the present disclosure built thereinto are also included in the present disclosure.

For example, the communication device 4 including the radio-frequency front end circuit and the RFIC 3 (RF signal processing circuit) described above is also included in the present disclosure. Low loss and high selectability can be realized by the communication device 4.

In addition, for example, an inductor provided on a path that connects a parallel arm resonator and ground via a switch is not limited to a wiring line that connects a connection node between the parallel arm resonator and a capacitor, and a switch, or to a wiring line that connects the parallel arm resonator and a connection node between the switch and the capacitor, and may instead be a wiring line that connects the switch and ground to each other.

Furthermore, for example, the length of the first wiring line and the length of the second wiring line may be different from each other and the line width of the first wiring line and the line width of the second wiring line may be different from each other. In this case, it is preferable that a long wiring line be wider than a short wiring line. This is because the Q value of the inductor is degraded when the wiring line has a long length, but the degradation of the Q value of the inductor can be suppressed by increasing the line width of the wiring line.

Furthermore, for example, in embodiment 3, the inductance values of the inductors of the three parallel arm resonance circuits of the filter 30 are different from one another, but it is sufficient that the inductance values of the inductors of at least two parallel arm resonance circuits among the three parallel arm resonance circuits be different from each other.

In addition, for example, in embodiment 3, the filter 30 includes two series arm resonance circuits and three parallel arm resonance circuits, but not limited to this, may instead include three or more series arm resonance circuits and four or more parallel arm resonance circuits. In this case, a plurality of fifth parallel arm resonance circuits are connected to different nodes between the node x1 and the node x2, and the first inductance value and the second inductance value are larger than the fifth inductance value of each fifth parallel arm resonance circuit. So long as the fifth inductance value of each fifth parallel arm resonance circuit is smaller than the first inductance value and the second inductance value, the fifth inductance values may be different values or identical values. Furthermore, it is sufficient that the inductance values of the inductors of at least two parallel arm resonance circuits among four or more parallel arm resonance circuits be different from each other.

Furthermore, all of the resonators or some of the resonators described above are not limited to acoustic wave resonators that utilize surface acoustic waves, and for example, may instead be formed of acoustic wave resonators that utilize bulk waves or boundary acoustic waves. In other words, all of the resonators or some of the resonators described above do not have to be formed of IDT electrodes. Also, in the case of an acoustic wave filter device including such resonators, the band width of an attenuation band can be increased and the attenuation amount of the attenuation band can be increased when the pass band is switched.

Furthermore, in the above embodiment, the multiplexer (duplexer) includes a transmission filter and a reception filter, but may instead include just a transmission filter or just a reception filter.

In addition, for example, inductors and capacitors may be connected between constituent elements of such a radio-frequency front end circuit or communication device. Such inductors may include wiring line inductors formed by wiring lines connecting the constituent elements.

The present disclosure can be widely used in communication devices such as cellular phones in the form of small-sized filters, multiplexers, front end circuits, and communication devices that can be applied to multi-band systems.

1, 1A radio-frequency front end circuit
2 antenna element
3 RF signal processing circuit (RFIC)
4 communication device
10, 10A, 20A-20D, 30, 40, 200A-200D filter (acoustic wave filter device)
111 input/output terminal
11$m$ input/output terminal (first input/output terminal)
11$n$ input/output terminal (second input/output terminal)
12-15 chip
16 wiring substrate
17 component mounting surface
18 wiring layer
50, 120 duplexer (multiplexer)
60 phase shifter
101 IDT electrode
101$a$, 101$b$ interdigital electrode
101$g$ adhesive layer
101$h$ main electrode layer
102 piezoelectric substrate
103 protective layer
110$a$, 110$b$ electrode finger
111$a$, 111$b$ busbar electrode
120A filter group
120Rx reception filter
120Tx transmission filter
130A, 130B transmission switch
140, 140A, 140B transmission amplification circuit
150A-150C reception switch
160, 160A, 160B reception amplification circuit
p1-p5 parallel arm resonator
s1, s2 series arm resonator (series arm resonance circuit)
x1-x3 node
C1-C5 capacitor (impedance element)
L1-L5 inductor
SW1-SW5 switch (switch element)

The invention claimed is:

1. An acoustic wave filter device comprising:
a first series arm resonance circuit provided on a path that connects a first input/output terminal and a second input/output terminal to each other;
a first parallel arm resonance circuit that is connected between a first node on the path and ground, the first node being closer to the first input/output terminal than the first series arm resonance circuit; and
a second parallel arm resonance circuit that is connected between a second node on the path and ground, the second node being closer to the second input/output terminal than the first series arm resonance circuit, wherein:

the first parallel arm resonance circuit comprises:
   a first parallel arm resonator that is connected to the first node,
   a first impedance element and a first switch connected in parallel with each other and each connected in series with the first parallel arm resonator, and
   a first inductor connected in parallel to the first impedance element and in series with the first parallel arm resonator and the first switch,
the second parallel arm resonance circuit comprises:
   a second parallel arm resonator that is connected to the second node,
   a second impedance element and a second switch connected in parallel with each other and each connected in series with the second parallel arm resonator, and
   a second inductor connected in parallel to the first impedance element and in series with the second parallel arm resonator and the second switch, and
an inductance value of the first inductor and an inductance value of the second inductor are different from each other.

2. The acoustic wave filter device according to claim 1, further comprising:
   a third parallel arm resonance circuit that is connected in parallel with the first parallel arm resonance circuit between the first node and ground; and
   a fourth parallel arm resonance circuit that is connected in parallel with the second parallel arm resonance circuit between the second node and ground, wherein:
   the third parallel arm resonance circuit comprises a third parallel arm resonator that is connected to the first node,
   the fourth parallel arm resonance circuit comprises a fourth parallel arm resonator that is connected to the second node,
   a resonant frequency of the first parallel arm resonator is different from a resonant frequency of the third parallel arm resonator, and
   a resonant frequency of the second parallel arm resonator is different from a resonant frequency of the fourth parallel arm resonator.

3. The acoustic wave filter device according to claim 2, wherein:
   the resonant frequency of the first parallel arm resonator is greater than the resonant frequency of the third parallel arm resonator, and
   the resonant frequency of the second parallel arm resonator is greater than the resonant frequency of the fourth parallel arm resonator.

4. The acoustic wave filter device according to claim 2, wherein the resonant frequency of the first parallel arm resonator is less than the resonant frequency of the third parallel arm resonator, and
   the resonant frequency of the second parallel arm resonator is less than the resonant frequency of the fourth parallel arm resonator.

5. The acoustic wave filter device according to claim 2, wherein:
   the third parallel arm resonance circuit further comprises a third impedance element and a third switch connected in parallel with each other and each connected in series with the third parallel arm resonator, and a third inductor connected in series with the third parallel arm resonator and the third switch,
   the fourth parallel arm resonance circuit further comprises a fourth impedance element and a fourth switch connected in parallel with each other and each connected in series with the fourth parallel arm resonator, and a fourth inductor connected in series with the fourth parallel arm resonator and the fourth switch.

6. The acoustic wave filter device according to claim 5, wherein an inductance value of the third inductor and an inductance value of the fourth inductor are different from each other.

7. The acoustic wave filter device according to claim 1, further comprising:
   a third parallel arm resonator that is connected in parallel with the first parallel arm resonator between the first node and ground; and
   a fourth parallel arm resonator that is connected in parallel with the second parallel arm resonator between the second node and ground, wherein:
   the first impedance element and the first switch are connected in series with both the first parallel arm resonator and the third parallel arm resonator,
the second impedance element and the second switch are connected in series with both the second parallel arm resonator and the fourth parallel arm resonator,
   a resonant frequency of the first parallel arm resonator is different from a resonant frequency of the third parallel arm resonator, and
   a resonant frequency of the second parallel arm resonator is different from a resonant frequency of the fourth parallel arm resonator.

8. The acoustic wave filter device according to claim 1, wherein:
   the first inductor is a first wiring line that connects the first parallel arm resonator and ground via the first switch, and
   the second inductor is a second wiring line that connects the second parallel arm resonator and ground via the second switch.

9. The acoustic wave filter device according to claim 8, wherein a length of the first wiring line and a length of the second wiring line are different from each other.

10. The acoustic wave filter device according to claim 8, wherein a width of the first wiring line and a width of the second wiring line are different from each other.

11. The acoustic wave filter device according to claim 1, wherein:
   a power input to the first input/output terminal is greater than a radio-frequency power input to the second input/output terminal,
   the first impedance element and the second impedance element are capacitors, and
   an inductance value of the first inductor is less than an inductance value of the second inductor.

12. The acoustic wave filter device according to claim 1, wherein:
   a power input to the first input/output terminal is greater than a radio-frequency power input to the second input/output terminal,
   the first impedance element and the second impedance element are inductors, and
   the first inductor is connected in series between the first parallel arm resonator and both the first impedance element and the first switch,
   the second inductor is connected in series between the second parallel arm resonator and both the second impedance element and the second switch, and
   an inductance value of the first inductor is greater than an inductance value of the second inductor.

13. An acoustic wave filter device comprising:
a first series arm resonance circuit provided on a path that connects a first input/output terminal and a second input/output terminal to each other;
a first parallel arm resonance circuit that is connected between a first node on the path and ground, the first node being closer to the first input/output terminal than the first series arm resonance circuit; and
a second parallel arm resonance circuit that is connected between a second node on the path and ground, the second node being closer to the second input/output terminal than the first series arm resonance circuit, wherein:
the first parallel arm resonance circuit comprises:
a first parallel arm resonator that is connected to the first node,
a first impedance element and a first switch connected in parallel with each other and each connected in series with the first parallel arm resonator, and
a first inductor connected in series with the first parallel arm resonator and the first switch,
the second parallel arm resonance circuit comprises:
a second parallel arm resonator that is connected to the second node,
a second impedance element and a second switch connected in parallel with each other and each connected in series with the second parallel arm resonator, and
a second inductor connected in series with the second parallel arm resonator and the second switch, and
an inductance value of the first inductor and an inductance value of the second inductor are different from each other, wherein:
a power input to the first input/output terminal is greater than a radio-frequency power input to the second input/output terminal,
the first impedance element and the second impedance element are inductors,
the first inductor and the first switch are connected in series with each other and in parallel with the first impedance element,
the second inductor and the second switch are connected in series with each other and in parallel with the second impedance element, and
an inductance value of the first inductor is less than an inductance value of the second inductor.

14. The acoustic wave filter device according to claim 11, further comprising:
a second series arm resonance circuit that is provided on the path between the first series arm resonance circuit and the second input/output terminal; and
a fifth parallel arm resonance circuit that is connected between a third node on the path and ground, the third node being between the first series arm resonance circuit and the second series arm resonance circuit, wherein:
the second node is located between the second series arm resonance circuit and the second input/output terminal,
the fifth parallel arm resonance circuit comprises:
a fifth parallel arm resonator that is connected to the third node,
a fifth impedance element and a fifth switch connected in parallel with each other and each connected in series with the fifth parallel arm resonator, and
a fifth inductor connected in series with the fifth parallel arm resonator and the fifth switch,
the fifth impedance element is a capacitor, and
the inductance value of the first inductor and the inductance value of the second inductor are less than an inductance value of the fifth inductor.

15. The acoustic wave filter device according to claim 12, further comprising:
a second series arm resonance circuit that is provided on the path between the first series arm resonance circuit and the second input/output terminal; and
a fifth parallel arm resonance circuit that is connected between a third node on the path and ground, the third node being between the first series arm resonance circuit and the second series arm resonance circuit, wherein:
the second node is located between the second series arm resonance circuit and the second input/output terminal,
the fifth parallel arm resonance circuit comprises:
a fifth parallel arm resonator that is connected to the third node,
a fifth impedance element and a fifth switch connected in parallel with each other and each connected in series with the fifth parallel arm resonator, and
a fifth inductor that is connected in series between the fifth parallel arm resonator and both the fifth impedance element and the fifth switch,
the fifth impedance element is an inductor, and
the inductance value of the first inductor and the inductance value of the second inductor are greater than an inductance value of the fifth inductor.

16. The acoustic wave filter device according to claim 13, further comprising:
a second series arm resonance circuit that is provided on the path between the first series arm resonance circuit and the second input/output terminal; and
a fifth parallel arm resonance circuit that is connected between a third node on the path and ground, the third node being between the first series arm resonance circuit and the second series arm resonance circuit, wherein:
the second node is located between the second series arm resonance circuit and the second input/output terminal,
the fifth parallel arm resonance circuit comprises:
a fifth parallel arm resonator that is connected to the third node,
a fifth impedance element and a fifth switch connected in parallel with each other and each connected in series with the fifth parallel arm resonator, and
a fifth inductor that is connected in series with the fifth switch,
the fifth switch and the fifth inductor are connected in series with each other and each is connected in parallel with the fifth impedance element,
the fifth impedance element is an inductor, and
the inductance value of the first inductor and the inductance value of the second inductor are less than an inductance value of the fifth inductor.

17. A multiplexer comprising:
a common terminal;
a transmission terminal;
a reception terminal;
a transmission filter provided on a path that connects the common terminal and the transmission terminal to each other; and
a reception filter provided on a path that connects the common terminal and the reception terminal to each other, wherein the transmission filter is the acoustic wave filter device according to claim 11, the first input/output terminal is connected to the transmission terminal, and the second input/output terminal is connected to the common terminal.

18. A multiplexer comprising:
a common terminal;
a transmission terminal;
a reception terminal;
a transmission filter provided on a path that connects the common terminal and the transmission terminal to each other; and
a reception filter provided on a path that connects the common terminal and the reception terminal to each other,
wherein the transmission filter is the acoustic wave filter device according to claim 11, the first input/output terminal is connected to the common terminal, and the second input/output terminal is connected to the transmission terminal.

19. A radio-frequency front end circuit comprising:
the acoustic wave filter device according to claim 1; and
an amplification circuit.

20. A communication device comprising:
an RF signal processing circuit configured to process a radio-frequency signal transmitted or received by an antenna; and
the radio-frequency front end circuit according to claim 19 configured to transmit the radio-frequency signal between the antenna and the RF signal processing circuit.

* * * * *